United States Patent
Kabel et al.

(10) Patent No.: US 6,792,057 B2
(45) Date of Patent: Sep. 14, 2004

(54) PARTIAL BAND RECONSTRUCTION OF FREQUENCY CHANNELIZED FILTERS

(75) Inventors: Allan M. Kabel, Hollis, NH (US); Thomas R. Vaccaro, Hudson, NH (US)

(73) Assignee: Bae Systems Information and Electronic Systems Integration INC, Nashua, NH (US)

( * ) Notice: Subject to any disclaimer, the term of this patent is extended or adjusted under 35 U.S.C. 154(b) by 0 days.

(21) Appl. No.: 10/303,498

(22) Filed: Nov. 25, 2002

(65) Prior Publication Data

US 2004/0042557 A1 Mar. 4, 2004

Related U.S. Application Data

(60) Provisional application No. 60/407,874, filed on Aug. 29, 2002.

(51) Int. Cl.[7] .............................. H03D 1/04; H04B 1/66; G10L 15/00
(52) U.S. Cl. ..................... 375/346; 375/240; 704/231
(58) Field of Search ................................ 370/330–347; 342/12; 375/316, 340, 240, 346; 455/303

(56) References Cited

U.S. PATENT DOCUMENTS

| | | | |
|---|---|---|---|
| 4,301,454 A | | 11/1981 | Bailey |
| 5,436,940 A | * | 7/1995 | Nguyen ..................... 375/240 |
| 5,537,435 A | * | 7/1996 | Carney et al. ............... 375/219 |
| 5,577,031 A | | 11/1996 | Smith |
| 5,926,455 A | * | 7/1999 | Allpress ..................... 370/210 |
| 6,085,077 A | * | 7/2000 | Fields et al. ................ 455/303 |
| 6,128,276 A | | 10/2000 | Agee |
| 6,314,207 B1 | | 11/2001 | Persiantsev et al. |
| 6,324,559 B1 | * | 11/2001 | Hellberg ..................... 708/321 |
| 6,356,569 B1 | | 3/2002 | Sonalkar et al. |
| 6,393,451 B2 | | 5/2002 | Leyonhjelm et al. |
| 6,426,983 B1 | * | 7/2002 | Rakib et al. ................ 375/346 |
| 6,628,781 B1 | * | 9/2003 | Grundstrom et al. ... 379/406.14 |
| 2001/0000660 A1 | * | 5/2001 | Kober et al. ................ 341/6 |
| 2001/0011290 A1 | * | 8/2001 | Kovacevic et al. ......... 708/308 |
| 2001/0025291 A1 | | 9/2001 | Leyonhjelm et al. |
| 2002/0122562 A1 | * | 9/2002 | Brennan et al. ............ 381/316 |
| 2003/0016772 A1 | * | 1/2003 | Ekstrand .................... 375/350 |
| 2003/0076899 A1 | * | 4/2003 | Kumar et al. .............. 375/316 |

OTHER PUBLICATIONS

Howard, Steven J., Narrowband Interference Rejection Using Small FTT Block Sizes, Oct. 11–14, 1992, IEEE Communications, vol. 2, pp. 608–612.*

Ranheim, A., Narrowband Interference Rejection in Direct-Sequence Spread–Spectrum Syatem using Time–Frequency Decomposition, Dec. 1995, IEE Proc–Commun., vol. 142, No. 6, pp. 393–400.*

Nguyen, Truong, Q., Partial Spectrum Reconstruction Using Digital Filter Banks, IEEE Transactions on Signal Processing, vol. 41 No. 9, Sep. 1993, pp. 2778–2795.

(List continued on next page.)

*Primary Examiner*—Stephen Chin
*Assistant Examiner*—Lawrence Williams
(74) *Attorney, Agent, or Firm*—Maine & Asmus

(57) ABSTRACT

A channelized filter design for partial band reconstruction having high dynamic range requirements. The analysis filter and synthesis filter constraints permit high performance signal detection with an alias free signal recombination capability for signals that span multiple frequency bins. The filter bank allows the use of a single wideband asset to provide for data channelized for detection processing with the ability to recombine one or more adjacent frequency bins into a wider bandwidth baseband time domain data stream suitable for exploitation processing. Use of an efficient partial band reconstruction mechanism allows signal reconstruction using only the frequency subchannels that pertain to the signal of interest that is to be copied. The filter design mechanism separates the specification of the analysis filter to support signal detection in environments of high dynamic range. The signal reconstruction (synthesis) filter uses fewer bins and allows a higher order filter.

20 Claims, 15 Drawing Sheets

OTHER PUBLICATIONS

Vaidyanathan, P. P., Filter Banks in Digital Communications, Dept. of Electrical Engineering, California Institue of Technology, Pasadena, CA, pp. 1–23.

Lu, Youhong et al., Biorthogonal–Like Sequences and Generalized Gabor Expansions of Discrete–Time Signals in $l^2(Z)$, IEEE 1995, pp. 1100–1104.

Harris, Fred, Digital Receivers, Cubic Signal Processing Chair, San Diego State University Aug. 21, 2002, pp. 1–25.

Karp, Tanja et al., Modified DFT Filter Banks with Perfect Reconstruction, IEEE Transactions on Circuits and System–II: Analog and Digital Signal Processing vol. 46 No. 11, Nov. 1999, pp. 1404–1414.

Lin Yuan–Pei et al. Application of DFT Filter Banks and Cosine Modulated Filter Banks in Filtering*, IEEE 1994, pp. 254–259.

Vaidyanathan, P.P. et al., A Review of the Theory and Applications of Optimal Subband and Transform Coders[1], Applied and Computational Harmonic Analysis, 2001, pp. 254–289.

PCT International Search Report dated Apr. 5, 2004 of International Application No. PCT/US03/21253 filed Jul. 8, 2003.

* cited by examiner

PARTIAL BAND RECONSTRUCTION OF FREQUENCY CHANNELIZED FILTERS

RELATED APPLICATIONS

This application claims the benefit of U.S. Provisional Application No. 60/407,874, filed Aug. 29, 2002, which is herein incorporated in its entirety by reference.

FIELD OF THE INVENTION

This present invention relates to signal processing and more particularly, to signal reconstruction and for filter design for partial band reconstruction of a wideband channelizer.

BACKGROUND OF THE INVENTION

Signal detection and reconstruction are areas of importance for military and commercial applications. In most signal intelligence schemes, the system attempts to analyze a wide bandwidth detected signal and then subdivide the wide bandwidth into smaller bands. The smaller bands are investigated for the signals of interest by examining the energy response.

The subchannels or bins contain regions of signal energy and the processing measures the power in the various bins to locate regions of interest that have significant detectable power levels. In one implementation the wideband detection bandwidth is converted into a frequency domain snapshot using Fast Fourier Transform (FFT) processing many times per second. The snapshots are aligned in time with the ability to revisit various stored frequency bins, and are in time with a time delay between each snapshot.

To focus on a particular narrow band signal of interest, a certain number of adjacent channels are recombined into a narrowband time domain stream of data that can be further processed. There have been various attempts to employ an inverse transform to the time domain within the window of bins that does not affect the output stream. Ideally, the signal intelligence community would like to perform the perfect partial reconstruction of the desired narrowband window with no distortion.

Cosine filter banks are used in the prior art, but generally these filters are used with real data and not complex data. The cosine filter banks generally employ the same filter on the analysis and synthesis side.

There are many digital receiver systems used in the vast telecommunications area, and the main purpose of these receivers is to extract information signals from the many other interfering signals and noise interference. One example of a receiver is the channelized receiver. A channelized receiver comprises an antenna and a radio frequency front end that intercept radio frequency energy and performs signal conditioning and down conversion to a convenient intermediate frequency (IF). There are a number of characteristics that increase the ability to intercept a radio frequency signal of interest. Namely, a broadband instantaneous frequency coverage, good sensitivity, large dynamic range, simultaneous signal detection, arbitration and parameter encoding, and fine frequency measurement.

One problem with high sensitivity, narrow band intercept receivers is tuning to receive a signal having an unknown frequency. Reducing the bandwidth of a receiver generally increases its sensitivity, but results in tuning difficulties because the narrow bandwidth must be more precisely centered with respect to the incoming signal. One way conventional radar intercept receiving systems have tried to eliminate this problem is to search for the unknown signal with a less sensitive wide band receiver, and, once having detected a signal, tune a narrow band receiver to the detected signal. As the signal-to-noise ratio of the unknown signal becomes lower, the more difficult it is to utilize this method. In addition, it is usually desirable to rapidly identify the unknown signal in order to quickly tune the narrow band receiver to that frequency. Accordingly, channelized receivers having a plurality of filters each defining a contiguous passband portion of a search bandwidth have been utilized to quickly identify a channel in which an unknown signal resides, this channel then being used to identify a tuning frequency for a narrow band receiver. However, as the dynamic range of an unknown input signal increases, it becomes more difficult to determine the frequency of the signal without the use of complicated and complex redundancy comparison circuitry which is required when strong input signals provide output signals of substantially equal magnitude at two or more of the channelizer filters.

In order to widen RF bandwidth and improve the probability of intercept, the channelized receiver uses a number of contiguous filters, called a filter bank, to sort the input signal into segments of predetermined frequency. An input signal with a certain frequency will fall into a certain filter, and by measuring the output of the filters, the input signal frequency is estimated. Channelization generally refers to the filtering, decimation, interpolation and frequency conversion of received signals. A channelizer divides a wide receiver frequency band into many narrow frequency "bins" or channels, so that the receiver can and digitally process each individual channel separately. The channelizer can be used in conjunction with a parameter encoder. The parameter encoder characterizes each received RF signal in accordance with a predetermined set of parameters, such as frequency, pulse width, amplitude, time of arrival, type of modulation.

The analog channelized receiver is relatively expensive to fabricate because of the large number of filters required. In addition, the analog receiver size is bulky and the maintenance is difficult because it requires a large number of components. The digital channelized receiver requires a contiguous set of digital band pass filters with linear phase that cover the IF bandwidth. This coverage can be accomplished with a set of discrete digital filters, or the digital filter bank can also be effectively implemented by performing the short time Fourier transform which in effect performs the discrete Fourier transform on weighted and overlapped partitions of a collection of discrete time signals.

The short time Fourier transform complex modulates a low pass filter h(n) to form a uniform filter bank having one filter centered at each frequency bin of the fast Fourier transform. The low pass filter h(n) is, in effect, used to window the data. The established window slides across the data and then the discrete Fourier transform is calculated to give a frequency versus time output. Between successive fast Fourier transform calculations, M points are skipped which results in the output being decimated in time by M. It is also possible to generate a fine frequency digital channelized receiver by using an instantaneous frequency measurement algorithm. Such an instantaneous frequency measurement receiver uses the phase data generated by the short time Fourier transform filter bank to generate the fine frequency selection capability of the digital channelized receiver.

A prior art analog receiver system receives a radio frequency (RF) signal that is received by the antenna and then downconverted to an intermediate frequency (IF) by a RF front end. The RF front end typically comprises low noise amplifiers (LNAs) to boost the signal from the low reception power, filters to remove some of the noise, and mixers to downconvert to IF using a local oscillator signal. The receiver channelizer then extracts the desired channel. The channelizer generally has LNAs, mixers and filters. The selected channel is then processed at baseband by the receiver baseband unit to produce the received digital data stream.

In more state of the art receivers, there are more digital implementations than analog. Baseband processing generally has analog-to-digital conversion, digital filtering, decimation, equalization, demodulation, channel decoding, de-interleaving, data decoding, and timing extraction. In the case of multiple channels, the processing is performed in a similar fashion but the path is split to form multiple paths for each channel being processed with the digital interface being somewhere between the RF front end/back end and channelizer/de-channelizer blocks. This digitized implementation includes multistandard radio, wideband digital tuners, wideband radio or software defined radio.

Efficient digital channelizer/de-channelizer structures, that perform filtering, decimation/interpolation and frequency conversion, are important in terms of power consumption and die area on a per channel basis. One of the main goals of these structures is to integrate as many channels into a single Integrated Circuit (IC) as possible.

FIG. 1a depicts one approach to channelization of a prior art receiver 70 for a single channel with an incoming Frequency Division Multiplexed (EDMA) signal 75. A local oscillator (LO) 85 of frequency a downconverts the amplified RF input 75 in the mixer 80 to generate an intermediate frequency (IF) 90. A bandpass filter 95 selects the desired channel and an analog-to-digital converter (ADC) 100 converts the resulting output to digital form by sampling the analog signal at an appropriate frequency. Generally, the sampling frequency is at least twice the channel bandwidth to satisfy the Nyquist requirement. The sampled digital data, x(n), is bandshifted digitally by mixer 105 and digital detector 110 by multiplying with a phasor $e^{-12\pi(\overline{kn}/N)}$ denoted by $W_N^{kn}$, where k denotes the channel selected by the receiver. The resulting signal is low-pass filtered using a digital low pass filter 115. For multiple channels contained in the received signal, then one receiver path is needed for each of the channels. Downsampling or decimation 117 is required at the output.

A different approach to digital channelization is shown in FIG. 1b, wherein a conventional polyphase approach is taken. There are M channels of bandwidth B that are received simultaneously in a FDMA signal 120. After M channels, each of bandwidth B, are passed through an analog BPF (not shown) they are output to an A/D converter 125 which samples at some rate that is at least equal to the Nyquist rate (2 MB) for a signal of bandwidth MB. In this example, the data is sampled at 2 NB where N is greater than or equal to M. The digital output x(n) is applied to a 2N pole 130 that distributes the input data x(n) to 2N filters 135. Each filter 135 is updated once every 2N points. Filters 135 perform the channel extraction function. The time series output of filters 135 is applied to respective inputs of an FFT processor 140 which processes the data once every 2N points to produce 2N complex outputs of which M outputs are chosen, each representing the bandshifted subchannel signal at B Hz, the update rate of FFT processor 140. Only M outputs of FFT processor 140 are required since the sample rate 2 NB, as mentioned, can be higher than the minimum required sample rate 2 MB.

The power of optimized filter banks has been extended from the early uses for compression of speech, images and video signals to digital communications. In particular, the optimization of filter banks using statistical models has yielded significant improvements in increasing signal detection in multi-user environments of limited bandwidth.

Referring to FIG. 2a, a standard M-channel filter bank is shown with the several distinct sections, namely an Analysis bank 200, M-fold decimator 210, subband processors 220, M-fold expander 230 and a Synthesis bank 240. The input signal x(n) is coupled to the Analysis bank 200 for each channel, where H(z) is an abbreviation of $H(e^{j\omega})$. The subband processors Pi 220 are normally quantizers in this example, but can represent other operators.

FIG. 2b refers to a uniform filter bank with polyphase filters. A delay chain 250 feeds the set of M filters 260, $H_k(z)$, which is considered orthonormal if the polyphase matrix 270 $E(e^{j\omega})$ is unitary for all $\omega$. The subband processors 280 are disposed between the polyphase matrices 270, 290. The decimators 260 are considered uniform in this example as they are identical to each other. The expanders 300 are essentially inverse of the decimators 260 in this example. A biorthogonal filter bank system exists if the matrix $R(e^{j\omega})$ 290 is the inverse of $E(e^{j\omega})$ 270 for all $\omega$.

The division of the wide frequency band into narrow channels is sometimes performed using uniform polyphase filter banks. The highest RF frequency that can be processed is generally limited by the sampling rate capability of the polyphase filters. The Nyquist rate in most applications is the minimum sampling rate at which a particular RF frequency can be measured, and is equal to twice the particular RF frequency. The bank of polyphase filters must be able to run at the Nyquist rate corresponding to the highest frequency of the RF band of the receiver, and the reason that a filter bank would be operated at this rate is that this is the slowest rate at which it can be operated to cover the receiver's RF frequency band, and determine the clock rate for which the hardware must be designed. In general, minimizing the hardware clock rate reduces hardware costs.

Digital receivers using uniform polyphase filter banks operating at the Nyquist rate suffer from the problem of aliasing between channels. Aliasing is a well-known problem in digital systems, and alters frequencies outside the Nyquist bandwidth map to frequencies that are either higher or lower than the actual frequency of the received signal. One way of eliminating aliasing between channels is to oversample the received signal and run the hardware including the polyphase filter banks at a rate exceeding the Nyquist rate. However, oversampling the signal and running the hardware at the higher rate is not desirable because it makes building the hardware for a wide frequency bandwidth (e.g., 1 GHz) costly or difficult, if not impossible with current technology.

Another way of eliminating aliasing between channels for a given RF signal bandwidth is to employ filters with narrower frequency bins (i.e., "narrower" filters) and employ a proportionately greater number of such narrower filters in the polyphase filter bank. However, narrowing the filters and increasing their number is not desirable because it increases the physical size of the hardware, and therefore increases the power consumption and heat dissipation.

The digital channelized receiver has several known limitations. A first limitation is caused by the structure of the filter bank and the pulsed nature of the input signals. In order to have continuous coverage across the instantaneous bandwidth, adjacent channel responses are overlapped to a large degree. In this respect, the channelized receiver acts like a spectrum analyzer. Thus, there is a great deal of crosstalk between the channels, even when the input is a simple continuous wave signal. This situation is exacerbated when a pulsed signal is input because the leading and trailing edges of the pulse contain a great deal of broad band energy which spills into adjacent and non-adjacent channels, and the out-of-channel, time-domain output responses have a peak on the leading and trailing edges of the pulse due to the impulse response of the filters. Due to these combined effects there is a second limitation in that there must be some method to "arbitrate" between the filter channels and determine in which channel the input signal truly resides. The remaining responses are then classified as out-of-channel responses and discarded.

The frequency resolution capability or the ability to resolve and process two signals closely spaced in frequency, is limited by the receiver's arbitration capability. Currently, techniques such as amplitude comparison of adjacent channels and techniques that detect the presence of the "rabbit-ear" effect have been used to perform channel arbitration. Both of these approaches use only the amplitudes of filter bank outputs and have inherent limitations. Implementation of a known architecture, described by L. R. Rabiner and R. E. Crochiere in "Multi-Rate Digital Signal Processing", Prentis Hall, Englewood Cliffs, N.J., 1983, which could provide accurate arbitration capability, requires an inefficient number of decimators, expanders and polyphase filter components to be practical within the context of the digital receiver.

There have been various attempts to alleviate the problems described herein. The concept of a digital, channelized instantaneous frequency measurement receiver is further described in U.S. Pat. No. 5,499,391. For example, a basestation transceiver can implement a high speed analog-to-digital (A/D) converter and equipment which makes use of efficient digital filtering algorithms such as the Fast Fourier Transform (FFT) to separate the incoming signal energy into multiple baseband channels. On the transmit side, this implementation includes an inverse FFT processing combiner that outputs a combined signal representative of the contents of the baseband signal provided to it.

In U.S. Pat. No. 6,356,569, a digital channelizer with an arbitrary output sampling frequency is described. The digital channelizer uses a polyphase filter element in which a shift register is used to commutate time series data to a bank of polyphase filters.

In U.S. Pat. No. 6,393,451, a block compensator is inserted in the channelizer/de-channelizer chain, wherein the block compensator corrects phase continuity problems thereby increasing the flexibility of the modified fast convolutional algorithm.

A channelizer receiver is disclosed in U.S. Pat. No. 6,085,077, wherein an optimized filter bank allows simple channel arbitration. Another wideband channelizer receiver incorporating a diversity switch in detailed in U.S. Pat. No. 5,577,031 wherein the strongest signals is connected for processing.

Previous channelized systems used only single bin time domain reconstruction or narrowband set-on receivers. The signal bandwidth and center frequencies have to be matched to the channelization of the signals of interest. Asset usage for set-on assets becomes prohibitive for dense environments. The inefficiency of processing and misallocation of resources increases costs and delays processing as well as not allowing wideband efficient coverage.

BRIEF SUMMARY OF THE INVENTION

The invention is devised in the light of the problems of the prior art described herein. Accordingly it is a general object of the present invention to provide a novel and useful technique that can solve the problems described herein.

One object of the invention is a multirate filter bank analysis/synthesis filter set that allows a high performance signal detection capability with an alias free signal recombination capability for signals that span multiple frequency bins. Previous signal intelligence (SigInt) systems have required separate assets dedicated for the wideband signal detection, with additional set-On receiver assets used for narrowband exploitation functions, such as Recognition, DF, etc . . . The present invention allows the use of a single wideband asset to provide for data channelized for detection processing with the ability to recombine one or more adjacent frequency bins into a wider bandwidth baseband time domain data stream suitable for exploitation processing.

The present implementation allows the use of an efficient partial band reconstruction mechanism that allows signal reconstruction using only the frequency subchannels that pertain to the signal of interest that is to be copied. The filter design mechanism utilizes the ability to separate the specification of the analysis filter to support signal detection in environments of high dynamic range. The signal reconstruction (synthesis) filter, since it utilizes fewer bins, is able to support most of the burden required for low mean squared error signal reconstruction (eg: a higher order filter).

The ability and design of filters in support of partial reconstruction is one of the overall aims of the present invention. The design solutions of the prior art do not address the conditions and requirements of the present invention and are generally unable to accommodate the partial band reconstruction described herein. Employing FFT banks of a high number of channels and operating in a high dynamic range requirements, the channelized data is filtered and if there is not a high stop band attenuation then signals create interference with other channels. Thus, a high stop band attenuation, such as 80–90 dB in the channelizer path is needed.

The analysis bank high dynamic range is not accounted for in the prior art that generally discusses a 20 dB dynamic range. The present invention has dynamic range of approximately 90 dB on the analysis side and 50 dB on the reconstruction side.

The filters on the analysis side and synthesis side that perform the desired processing taking into account the requirements and with a sample rate that is not too high to be prohibitive. Other methods assume real value signals as opposed to complex values and others simply cannot satisfy the constraints of the present invention.

One object is the separation of analysis/synthesis filter specification. Another object is that the multibin reconstruction performance is driven by the synthesis filter bank which has lower computational requirements than the analysis filter, as the synthesis filter only uses the frequency subchannels pertaining to the signal of interest.

Still other objects and advantages of the present invention will become readily apparent to those skilled in this art from the following detailed description, wherein we have shown and described only a preferred embodiment of the invention, simply by way of illustration of the best mode contemplated by us on carrying out our invention. As will be realized, the invention is capable of other and different embodiments, and its several details are capable of modifications in various obvious respects, all without departing from the invention.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION OF A PREFERRED EMBODIMENT OF THE INVENTION

The present invention in one embodiment operates a wider bandwidth slice already converted to baseband that has an analog to digital (A/D) converter and then a digital receiver that provides the wideband complex data. The present invention entails an N point FFT operating on the complex data.

Extensive research has been performed in the area of Multirate filter banks with the goal of developing an Analysis/Synthesis architecture that supports a large number of Analysis channels and partial band signal reconstruction. The solution showing the best performance with respect to the desired criteria is the use of the discrete Gabor expansion with the analysis and synthesis filters designed using biorthogonal-like sequence methods. This technique allows the specification of an analysis filter on the basis of desired frequency response characteristics. Using the analysis filter, the synthesis bank filter can then be solved such that the filter pair approximates the orthogonality constraints required for bin reconstruction in the least squares sense. To achieve the proper frequency and alias level characteristics requires a degree of oversampling in the filter bank.

As described herein, the Channelizer divides a large bandwidth, high sample rate complex data stream into a number of small bandwidth, low sample rate, equally spaced channels. In order to support the suppression of strong, frequency separated interferers, the channelizer requires a filter having high stopband attenuation. For one particular application, a stop band attenuation of at least 90 dB is required. The order of the filter should be large enough to support a "flat" passband frequency characteristic, yet have sufficient transition band rolloff to minimize adjacent channel correlation. The frequency response crossover point between adjacent Analysis channels should be designed to avoid nulls in detection coverage (i.e. minimization of scalloping loss).

In order to minimize the processing requirements and data transfer loading in the system, it is desired to decimate the sample rate out of each analysis channel as much as possible. This decimation should not come at the expense of degraded signal detection or excessive distortion of narrowband signal streams generated using the multibin synthesis process. Since individual Signals of Interest (SOI's) will typically have a bandwidth greater than that of an individual channel, the design of the Analysis filter bank and Synthesis filter bank must support the creation of narrowband time domain data streams through the recombination of a number of adjacent analysis bank channels. The output of this partial band synthesis process should produce validly sampled, wider bandwidth time domain complex data streams that have a minimum of amplitude and phase distortion.

Figure 1A:
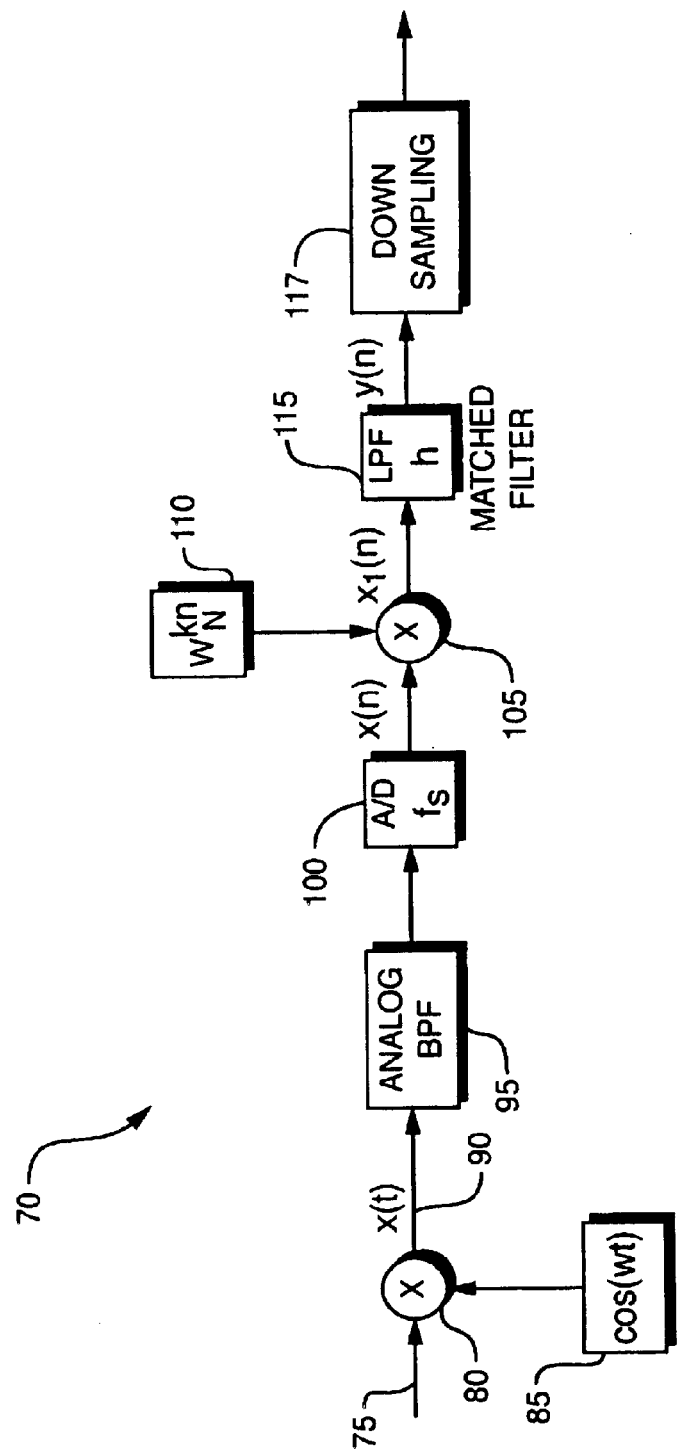
FIGS. 1a, 1b is a block diagrammatic view of a prior art single channel receiver channelizer
Figure 1B:
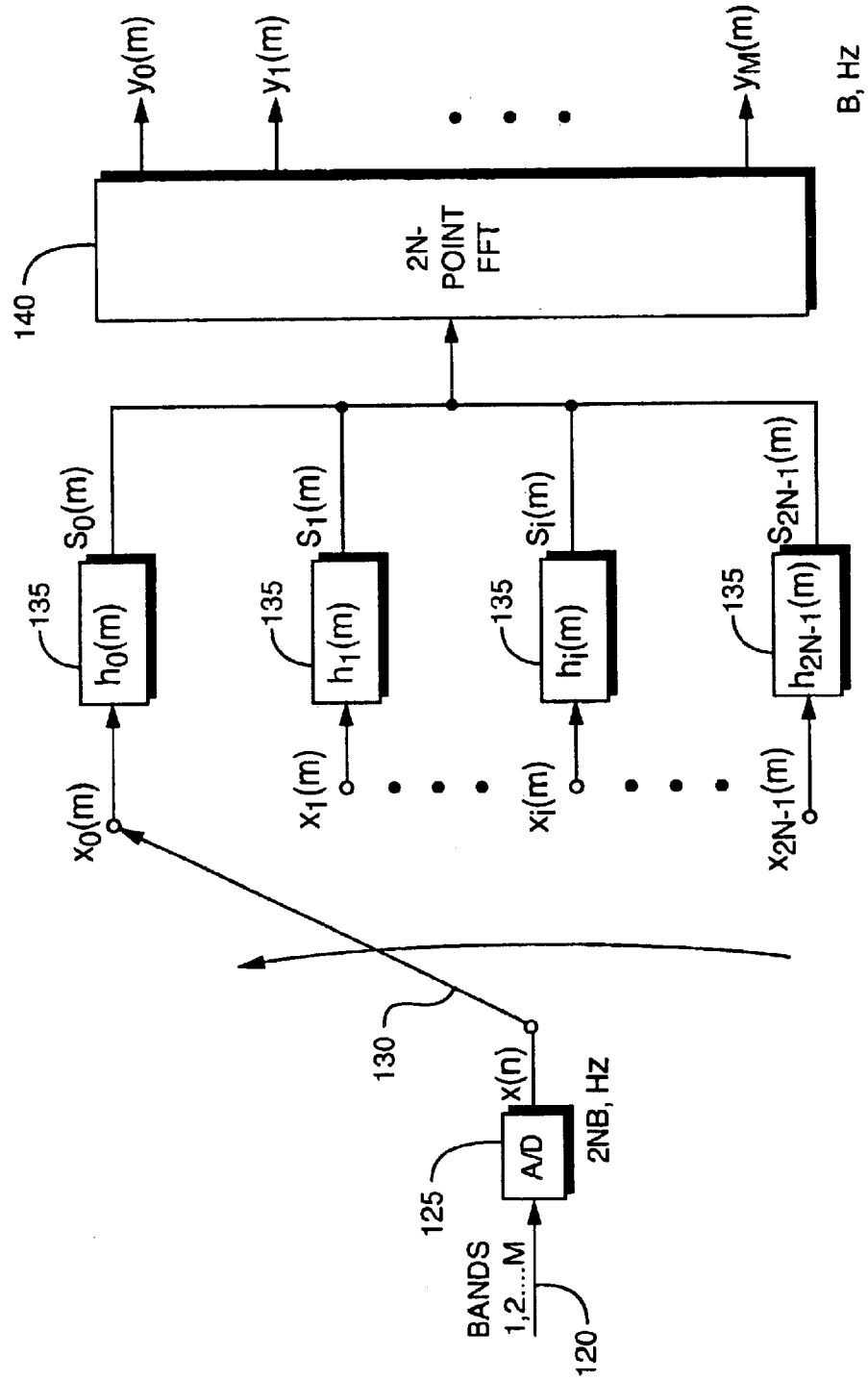
Figure 2A:
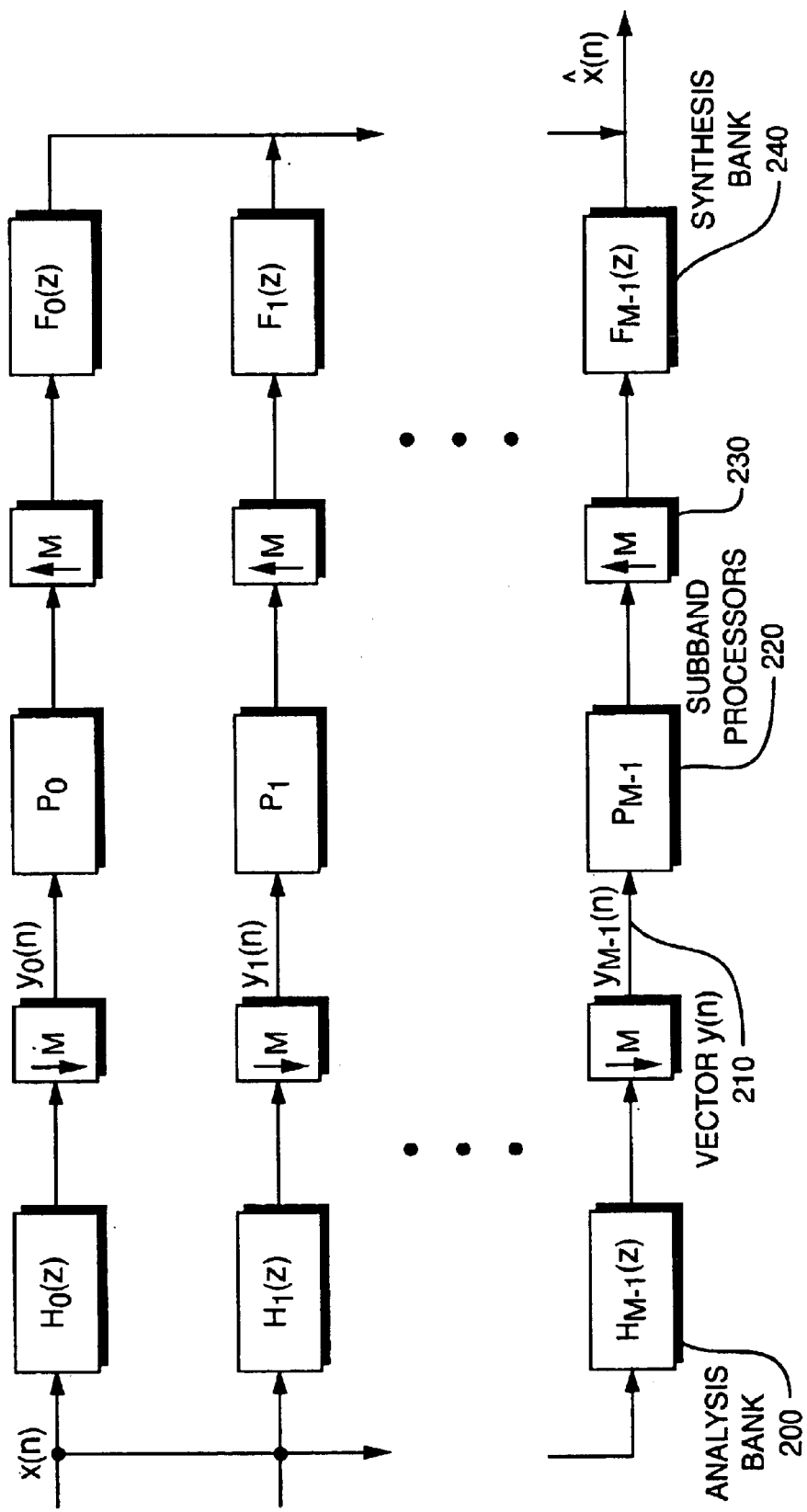
FIG. 2a is a prior art M-channel filter bank
Figure 2B:
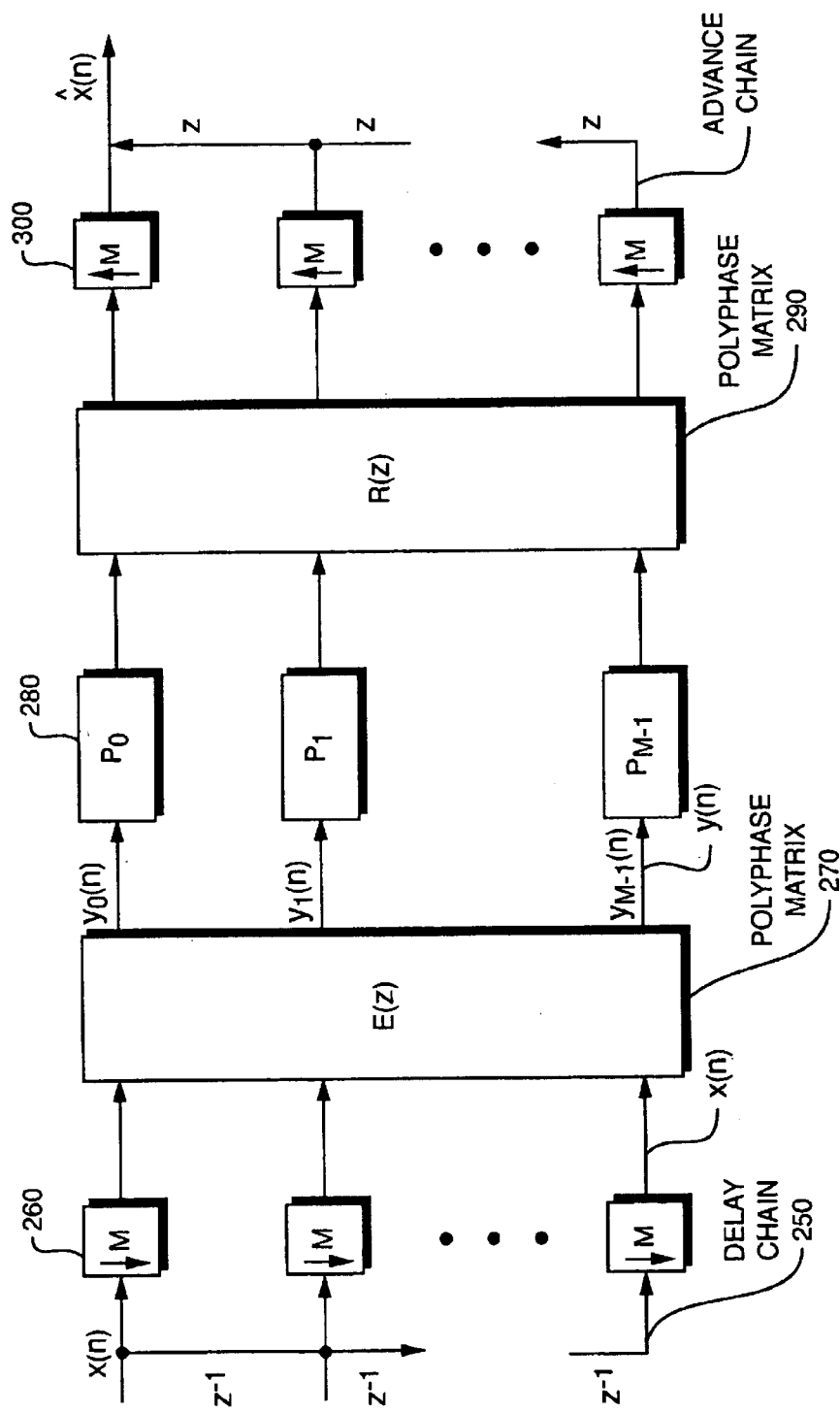
FIG. 2b is a polyphase M-channel filter bank
Figure 3B:
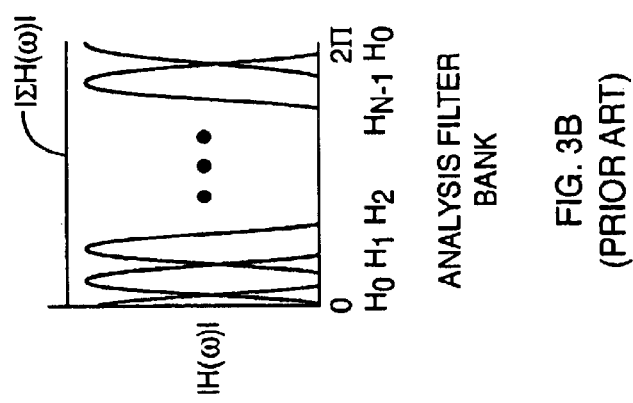
FIGS. 3a, 3b is an illustration of Analysis Filter Bank Architecture
Figure 3A:
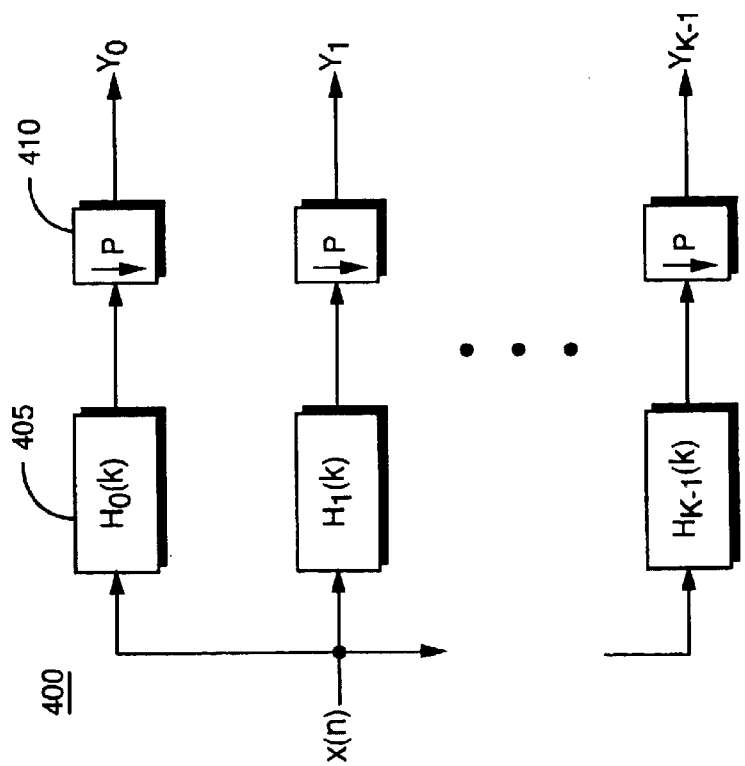

Referring to FIGS. 3a and 3b, the architecture of an analysis filter bank 400, along with the associated frequency response magnitude characteristic is shown. In order to provide uniform detection coverage across the band 0-2π, it is required that the frequency responses of adjacent channels H0, H1, H2 . . . overlap to some extent. The transition band response of the Analysis filters determines how many adjacent channels contribute significantly to the energy in a given channel. In the design of the Analysis filter, the overlap of a channel's frequency response is desired to span no more than the two adjacent channels (i.e. one bin on each side of the bin of interest).

FIG. 3a shows decimation 410 of each analysis channel by a factor P, which is detailed in the well-known text Multirate Systems and Filter Banks, P. P Vaidyanathan, 1993, as well as Nguyen, "Partial Spectrum Reconstruction using Digital Filter banks", IEEE Transactions on Signal Processing, Vol 41, No 9, September 1993, pp.2778–2795.

The transfer function for the decimated output of channel k is given as:

$$Y_k(z) = \sum_{i=0}^{P-1} H_k(z^{1/P} W_P^i) X(z^{1/P} W_P^i)$$  Equation (1)

where $$W_P^i = e^{-j2\pi \frac{i}{P}}.$$

The $0^{th}$ term corresponds to the desired term, while the remaining P-1 terms correspond to the alias components, which are shifted and expanded transformations of the analysis filter and the input signal. From this equation it can be seen that both the Analysis filter transfer function for each analysis filter 405 and the analysis bank decimation factor 410 determine the number of significant alias components that must be cancelled (or sufficiently minimized) by the synthesis process. It should be noted that if the decimation factor P is equal to the number of Analysis channels K (refer to FIG. 3a), then the filter bank is said to be critically sampled.

Figure 4B:
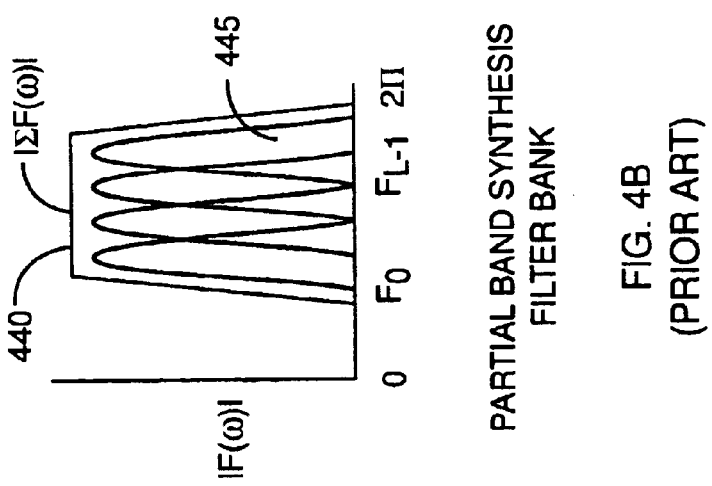
FIGS. 4a, 4b is an illustration of Analysis Filter Bank Architecture
Figure 4A:
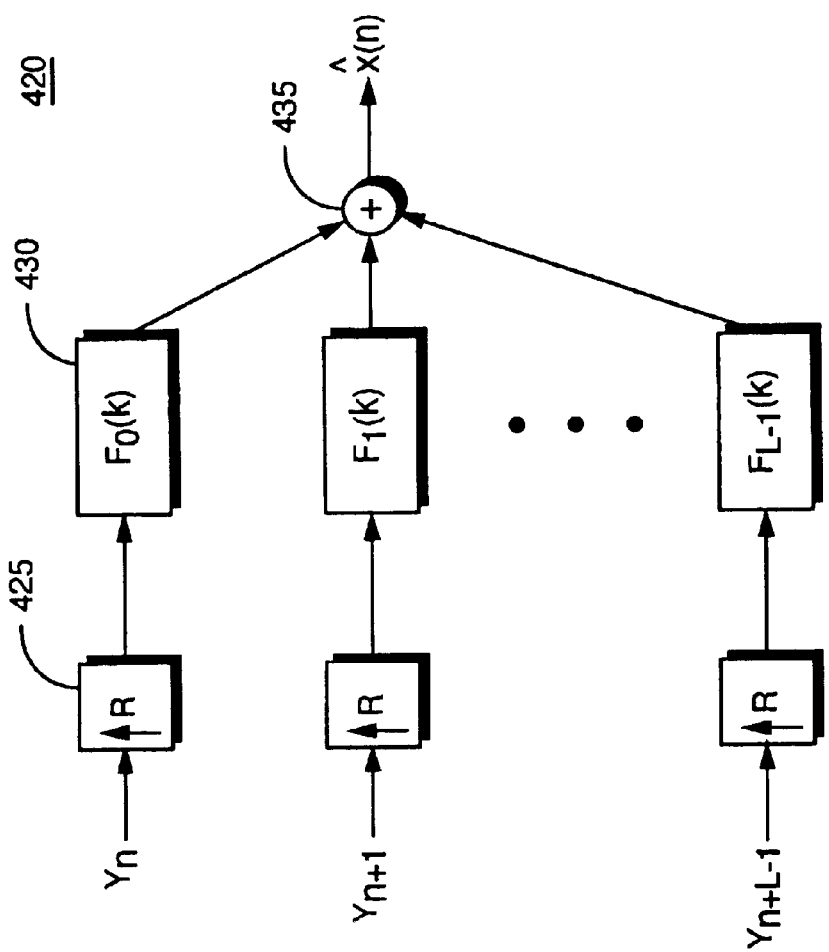

The synthesis bank in FIGS. 4a, 4b depict partial band reconstruction. From the K analysis channels, a subset of L adjacent channels is recombined to form an output data stream at L times the bandwidth of a single analysis channel. Since each channel is first interpolated by a factor of R, the sample rate of the recombined data will be R times that of a single analysis channel. Since interpolation by a factor of R generates R images of the channel transfer function, the transfer function of the reconstructed waveform is given by:

$$\hat{X}_n(z) = \sum_{i=0}^{L-1} F_{n+i}(z) Y_{n+i}(z^R) \quad \text{Equation (2)}$$

where n is the starting channel of the reconstruction. Equations (1) and (2) can be combined to show the composite Analysis/Synthesis transfer function:

$$\hat{X}_n(z) = \sum_{i=0}^{L-1} F_{n+i}(z) \sum_{j=0}^{P-1} H_{n+i}\left(z^{\frac{R}{P}} W_P^j\right) X\left(z^{\frac{R}{P}} W_P^j\right) \quad \text{Equations (3)}$$

Reordering to group the filter alias terms yields:

$$\hat{X}_n(z) = \sum_{j=0}^{P-1} X\left(z^{\frac{R}{P}} W_P^j\right) \sum_{i=0}^{L-1} F_{n+i}(z) H_{n+i}\left(z^{\frac{R}{P}} W_P^j\right) \quad \text{Equation (4)}$$

This is further described in Multirate Systems and Filter Banks, P. P Vaidyanathan, 1993 and Nguyen, "Partial Spectrum Reconstruction using Digital Filter banks", IEEE Transactions on Signal Processing, Vol. 41, No 9. September 1993, pp.2778–2795.

Figure 5:
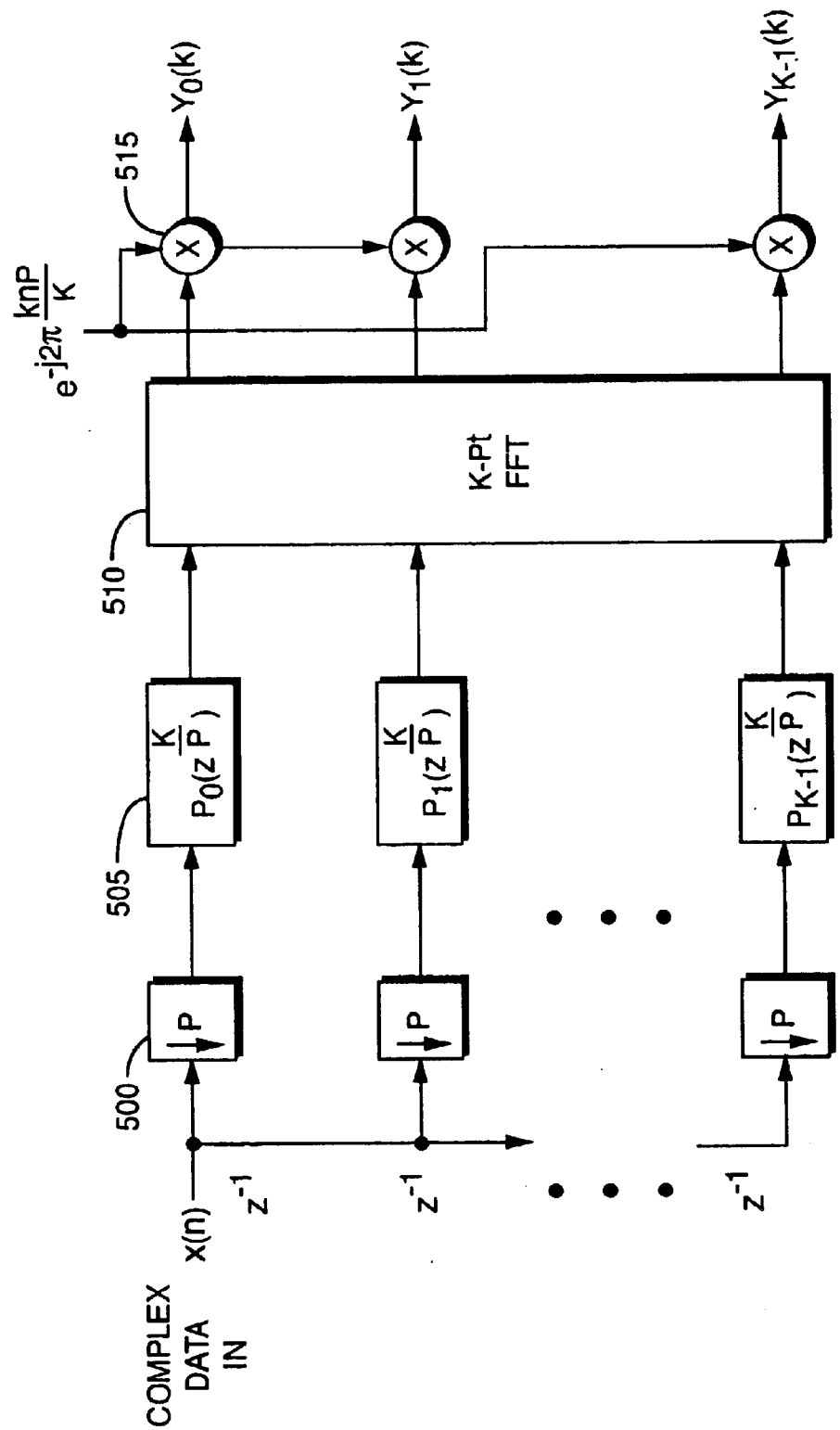
FIG. 5 illustrates a Polyphase Filter/FFT based Channelizer configured in accordance with an embodiment of the present invention

One embodiment of a polyphase filter FFT-based channelizer architecture of the present invention is depicted in FIG. 5. which is a computationally efficient variation as compared to bandpass filter version of FIG. 3a. The synthesis filter has a much smaller subset of input n signals as compared to the k users input to the analysis filter. The phase reduction only needs to be accounted for once to account for the mating of a subset of the larger input analysis filter to the small subset synthesis filter.

The prior art does discuss some form of subset input for partial reconstruction to the synthesis filter, but with significant differences. The prior art describes a different approach and utilizes common filter types for the analysis filter and frequency shifted filters. The design techniques to come up with the filter set of the present invention are described herein that derives the solution constraints.

Referring to FIG. 5, if the analysis filters 405 in FIG. 3a are generated by the complex modulation of a single filter, according to:

$$H_k(z) = \sum_{n=-\infty}^{\infty} h(n) z^{-n} W_N^k \quad \text{Equation (6)}$$

then the filter bank can be realized using the polyphase decomposition 505 of the filter followed by a K point FFT 510 as shown in Equation (1).

Each of the polyphase subfilters 505 is from the prototype by a K-fold decimation 500:

$$p_k(n) = h(k + nK) \quad \begin{array}{l} 0 \leq k \leq K-1, \\ 0 \leq n \leq M-1 \end{array} \quad \text{Equation (7)}$$

Where K is the number of channels and M-1 is the polyphase filter order.

The output channel data in FIG. 5 is labeled $Y_n(k)$, where k is the channel number and n is the output block. The signals are summed 515 to form the output channel data as shown.

Note that a residual phase rotation of $$e^{-j2\pi \frac{nkP}{K}}$$

is applied to each sample in order to remove the phase discontinuity/offset created by the block FFT processing. Residual phase rotation and polyphase decomposition in terms of data folding is discussed in detail in the prior art, such as Harris, Fred, "Time Domain Signal Processing with die FFT", Handbook of Digital Signal Processing, Edited by Douglas Elliot 1987.

Figure 6:
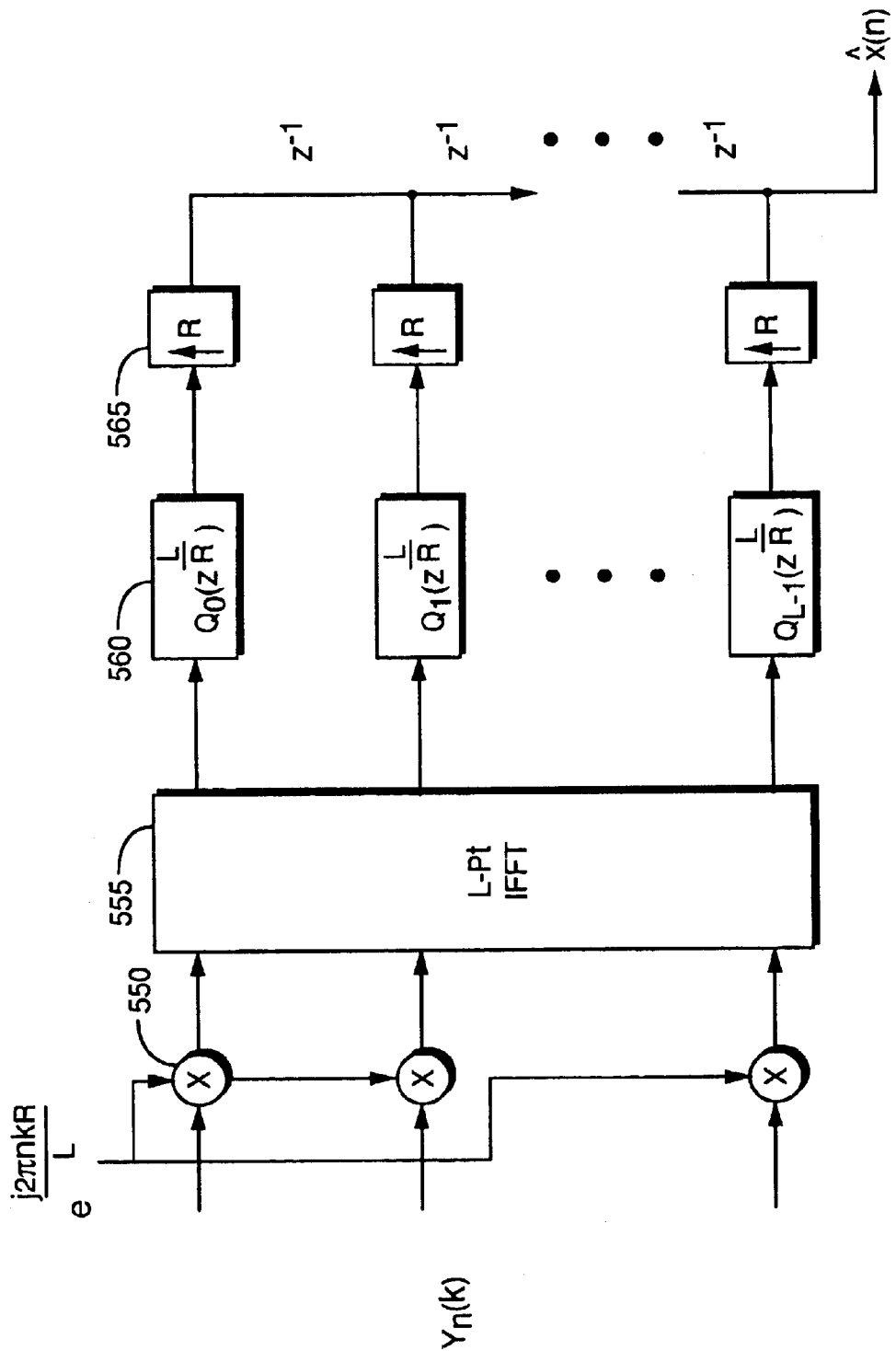
FIG. 6 illustrates a FFT/Polyphase Filter Synthesis Bank configured in accordance with an embodiment of the present invention

FIG. 6 depicts the FFT/polyphase filter based architecture for the recombination of L adjacent bins into a single time domain stream with approximately L times the bandwidth of a single channel. The reconstructed data is interpolated from the single bin sample rate by a factor of R. If the oversampling ratio (L/R) in the synthesis bank is equal to the oversampling ratio (K/P) in the analysis bank and if the starting channel of the synthesis is a multiple of the oversampling ratio, the phase correction terms in the two filter banks cancel since they reduce to conjugate pairs. If this is to be the standard operational usage, then corrections can thus be dropped in the implementation.

In operation, the channel data Yn(k) is summed 550 with a correction term of $e^{j2\pi nkR/L}$ which is intended to cancel the phase correction term of the analysis filter. The data is processed by the inverse FFT 555 and by the polyphase subfilters 560. The output of the polyphase subfilter 560 is expanded 565 and the time domain data is output.

The requirements on the channelizer analysis prototype filter response are quite exacting, and the design cannot be overly constrained by the signal reconstruction requirements. These needs are met by applying Biorthogonal-like sequence constraints in the design of the synthesis filter. This technique allows the present invention to concentrate on the frequency properties of the analysis filter and then constrain the synthesis filter to meet the reconstruction requirements. A detailed description of biorthogonal sequences is explained by Lu & Morris, "Biorthogonal-Like Sequences and Generalizer Gabor Expansions of Discrete-Time Signals in I/sup 2/(Z)", Signals, Systems and Computers, 1994; 1994 Conference Record of the Twenty-Eighth Asilomar Conference on Volume: 2, 1994, Page(s): 1100–1104 vol. 2.

The analysis filter prototype must provide a relatively flat passband along with high stopband attenuation. In order to minimize processing requirements, the order of the filter must also be minimized, ideally limited to no more than four times the number of channels. In order to provide adequate detection coverage, it is desired to have adjacent channel frequency response overlap at sufficiently low attenuation so that nulls in detection coverage do not exist. Two methods of filter design show promise: window based and equiripple.

In the window based design, the Nyquist II criteria states that an Mth band filter, one having zeros at intervals of M points from the center tap, except for the center tap itself, has a Power complementary frequency response:

$$C(e^{j\omega}) = \sum_{k=0}^{N-1} |X(e^{j\omega} W_N^k)|^2 \qquad (8)$$

Where $C(e^{j\omega})$ is a constant.

A simple technique for (approximately) designing M-th Band filters is to use window based filter designs. Window designs are based on the window weighting of a truncated sync pulse, which is the inverse Fourier transform of an ideal brick wall low pass filter with cutoff frequency $\pi/M$. The infinite duration sync pulse has the Mth band property, the truncation of which results in some level of distortion.

Figure 7:
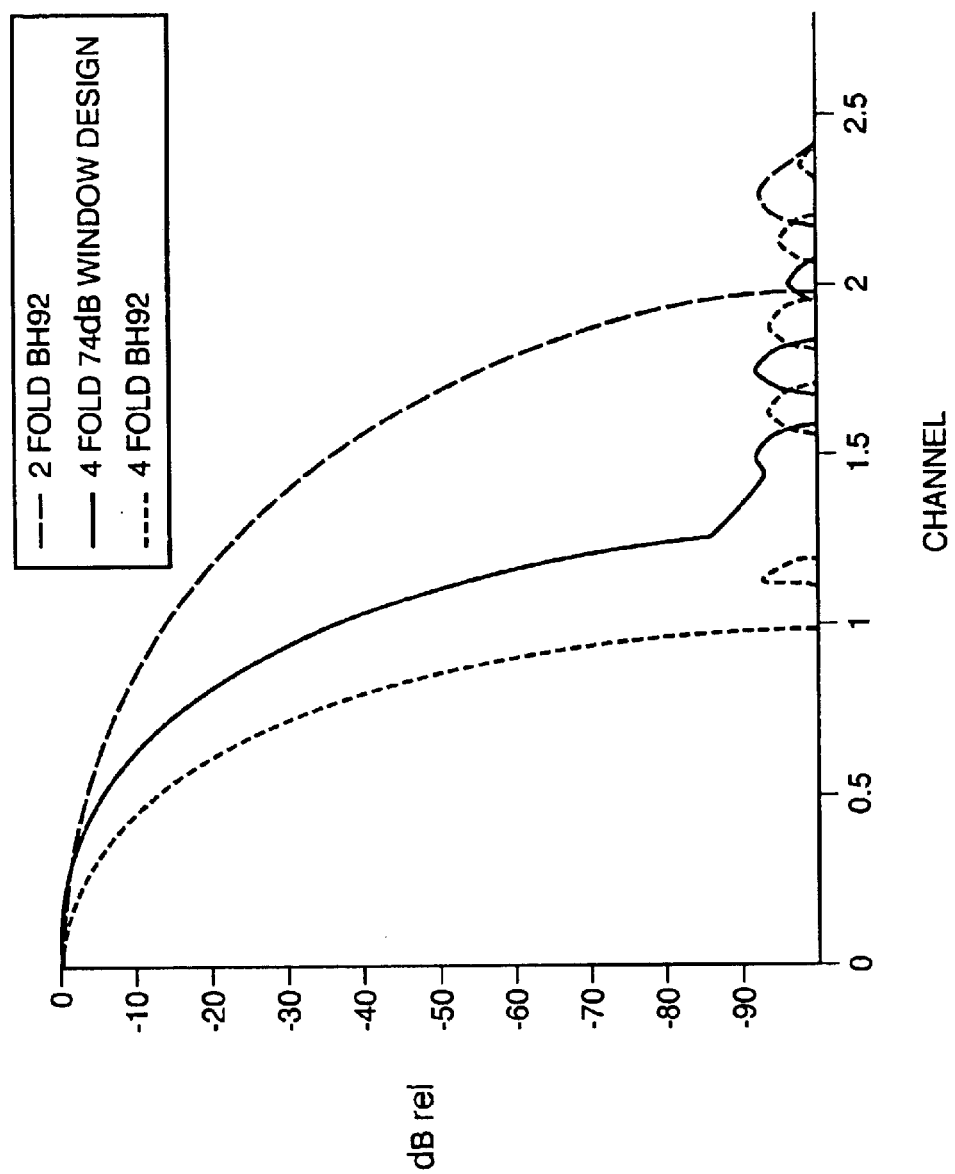
FIG. 7 illustrates Frequency Response of Analysis Filter Prototype Filters

A Blackman-Harris 74 dB window was used to generate a filter for the Analysis bank. The frequency response is shown in FIG. 7. As a comparison, 4 term 92 dB Blackman Harris windows of 2 and 4 times the FFT length are plotted. Note that the designed filter provides a better combination of passband (i.e. flatness) with transition band (i.e. steepness) response than do the windows alone. Spectral leakage into to the $2^{nd}$ adjacent bin is minimal with the designed filter. The adjacent channel crossover has approximately 6 dB of attenuation (i.e. 0.5 on the X axis (Channel) in FIG. 7). In addition, the window filter has better stop band attenuation in the outer bins of the channelizer, reaching better than approximately 140 dB, whereas the window alone tops out at 120 dB stopband attenuation. The window used in this design merely shows the effectiveness of the concept, additional windows could be tried to achieve a more ideal main lobe width/stop band attenuation level tradeoff.

The equiripple design technique is based on the Remez Exchange algorithm which designs FIR filters having equal ripples in the stopband response, and a different set of (equal) ripples in the passband. Filters designed by this algorithm tend to have flatter response curves with sharper transition: the degrees of freedom afforded by the tap coefficients get spent minimizing the maximum stopband errors rather than driving down the stopband response the 6 dB per octave typical of window-based filters. One complication of this method is the inability to create filters larger than a few hundred taps. To overcome this limitation prior art filter designs employ the Interpolated FIR (IFIR) filter design technique, use Multirate Systems and Filter Banks, P. P Vaidyanathan, 1993. In this method, an appropriate, low order equiripple prototype gets interpolated to a higher order with the specified response transition region. The interpolation images are then eliminated using a fairly low order low pass interpolation filter (also equiripple) having a flat passband response and adequate stopband attenuation, but otherwise having a fairly mild transition response.

In dealing with the data synthesis issue of the MBR Architecture, a number of avenues were explored in trying to devise an architecture that would meet the design constraints previously mentioned. A brief discussion of the additional techniques researched is presented prior to discussing biorthogonal filter banks, for example, Harris, Fred, "Time Domain Signal Processing with the FFT", Handbook of Digital Signal Processing, Edited by Douglas Elliot. 1987; Lu & Morris, "Biorthogonal-Like Sequences and Generalizer Gabor Expansions of Discrete-Time Signals in I/sup 2/(Z)", Signals, Systems and Computers, 1994; 1994 Conference Record of the Twenty-Eighth Asilomar Conference on Volume: 2, 1994, Page(s): 1100–1104 vol. 2; and Multirate Digital Signal Processing, Crochiere and Rabiner, 1983.

With respect to Critical Sampling and Complex Modulated Filter Banks, a concerted effort was made to determine if critical sampling is attainable in a DFT based architecture. In arguments presented by the prior art, the analysis/synthesis filter bank constraints for perfect reconstruction are developed. It can be shown that the requirements for perfect reconstruction are met when the polyphase analysis/synthesis subfilters are related as follows:

$$p_n * q_n(s) = \delta(s) \qquad \text{Equation (9)}$$

where $\delta(s)$ is the dirac delta function. The z-transform equivalent is:

$$P_n(z)Q_n(z)=1 \qquad \text{Equation (10)}$$

An exact solution is possible for two cases: 1) The polyphase subfilters are trivial, i.e. delays, or 2) given a FIR analysis subfilter, the polyphase Synthesis filter is the IIR inverse. For reasons of either insufficient low pass performance or instability, neither of these solutions yields a reasonable implementation. The prior art in Multirate Systems and Filter Banks, P. P Vaidyanathan, 1993, shows a lattice based architecture.

The difficulties with critical sampling notwithstanding, the present invention adapts a critical sampling approach. In Swaninathan and Vaidyanathan, "Theory and Design of Uniform DFT, Parallel, Quadrature Mirror Filter Banks", IEEE Transactions on Circuits and Systems, VoL CAS-33, No. 12, December 1986, if one uses FIR synthesis filters, then one can eliminate frequency aliasing in the reconstructed output and trade off reconstruction distortion with stopband performance; however, the synthesis filter requires an exceedingly large order. Complicating the problem further, the issue of partial band reconstruction would require the design of a filter whose decimated version satisfies the above requirements. While this approach was experimented with, it yielded poor results and appeared ultimately impractical.

A filter bank architecture that readily supports critical sampling is the cosine filter bank. This filter bank structure is based on a single prototype filter modulated by a cosine term (versus a complex exponential in the DFT filter bank). Adjacent channel alias terms are cancelled by the use of additional phase terms and delays in the cosine modulation block. The derivations of the prior art focus on using analysis and synthesis filters that are paraunitary and using time reversed analysis coefficients for the synthesis bank filter. Under these constraints, the perfect reconstruction property is met for a Cosine Filter bank if the polyphase components of the prototype filter satisfy a pairwise power complementary constraint:

$$\tilde{G}_k(z)G_k(z)+\tilde{G}_{M+k}(z)G_{M+k}(z)=\alpha \ \ 0 \le k \le M-1 \qquad \text{Equation (11)}$$

where $\tilde{G}_k(z)$ is the z-transform of the time flipped and conjugated coefficients of $G_k(z)$. Compared with the DFT filter bank constraints of equations (9) and (10), the extra degrees of freedom afforded the Cosine bank prototype simplifies the filter design problem while still allow critical sampling. See Multirate Systems and Filter Banks. P. P Vaidyanathan, 1993.

At first inspection, cosine modulation does not fit with the need of working with complex input data and generating complex output data in support of detection (both single and multichannel). However, a cosine filter bank can be implemented through the use of "SSB modifications" (i.e. quarter translate both time and frequency) to the FFT based architecture to create the appropriate doubly odd time and frequency offset. Such an implementation creates the complex term required for detection along with storing of the real data as required for subsequent time domain reconstruction. Currently, however, a processing algorithm taking complex data in is not available that can compute both the complex and cosine filter bank output using a reduced FFT size (Note, a critically sampled cosine bank still has an overlap factor of M/2. In fact, additional processing must be performed to apply the appropriate phase modifications to the FFT data. The savings would be in that time domain data is stored critically sampled (half that of complex data at two times oversampling). There is no computational savings in using the cosine filter bank approach.

Although equation (11) is less constrained than it's complex counterpart, the algorithms associated with designing Analysis/Synthesis filters that meet the Paraunitary constraints rely on the use of minimization techniques. The minimization for large order filters tends to get stuck in the many local minima, not achieving true minimization of the error function. A lattice based design technique that initially appeared promising had difficulty generating filters with better than a 50 dB stopband attenuation.

Another avenue explored was based on pseudo-QMF design techniques as used by Karp and Fleige, "Modified DFT Filter Banks with Perfect Reconstruction", IEEE Transactions on Circuits and Systems-II: Analog and Digital Signal Processing, Vol. 46, No. 11, November 1999. These filters start with weighted raised cosines to create a prototype filter with sufficient stopband attenuation, yet approximate the M-th band property required for perfect reconstruction. These filters are easier to optimize in that there are fewer parameters over which to optimize the design. The filters designed required either too high of an analysis filter order, or traded between unacceptable amplitude distortion and alias level.

A reference to Underdecimated Filter Banks is described in Lin and Vaidyanathan, "Application of DFT Filter Banks and Cosine Modulated Filter Banks in Filtering", IEEE Asia-Pacific Conference on Circuits and Systems, 1994, pp.254–259, developed the theory of under decimated filter banks and show that for a twice oversampled filter bank, the alias transfer function is equal to:

$$A_i(z) = \frac{1}{M} \sum_{k=0}^{2M-1} H_k(zW^{2i})F_k(z) \qquad \text{Equation (12)}$$

(In the above equation, the number of channels is 2M with a decimation factor of M. This can be seen as a specific instance of equation (4)).

This implementation expounded that since the alias terms created by the expansion are spaced by $2\pi/M$, then it is possible to design any analysis filter that satisfies the M-th band constraint. The corresponding synthesis bank filter is then designed with a larger, flatter passband such that the composite response does not vary from an M-th band characteristic. Additionally, the synthesis filter must then have a stopband such that:

$$H(z)F(zW^2) \approx 0 \qquad (13)$$

The degree to which this approximation is true depends on the sharpness of the transition bandwidth of both the analysis and synthesis filters. This requires both filters to generally be of very high order, with a polyphase order of 16 or more. Even so, because this is an approximation technique, there is always some degree of amplitude distortion created in the filter bank transfer function. This technique is applicable to both DFT and Cosine Filter banks.

The approach that yielded the best solution was based on Biorthogonal filter design techniques applied to the discrete Gabor transform (or sampled short-time Fourier transform). This approach uses an alternative solution to satisfy the orthogonality conditions required for perfect reconstruction in DFT filter banks as developed in the well known text Multirate Digital Signal Processing, by Crochiere and Rabiner, 1983. Analysis and synthesis filter banks can be generated using design techniques outlined in either the text by Qian and Chen, Joint Time-Frequency Analysis, Englewood Cliffs, N.J.; Prentice hall, 1996 or the paper by Lu & Morris. "Biorthogonal-Like Sequences and Generalizer Gabor Expansions of Discrete-Time Signals in I/sup 2/(Z)", Signals, Systems and Computers, 1994; 1994 Conference Record of the Twenty-Eighth Asilomar Conference on Volume: 2, 1994, Page(s): 1100–1104 vol. 2.

Starting with an analysis filter designed to meet a set of frequency response (or other) criteria, the dual function, or synthesis filter can then be solved for such that the pair satisfy the perfect reconstruction orthogonality conditions. The synthesis filter is the solution to the set of linear constraints:

$$\sum_{i=-\infty}^{\infty} g(k-iN)\gamma^*(k-iN-uM) = \delta(u)/M \quad 0 \le k \le N-1 \qquad \text{Equation (14)}$$

where g(k) is the analysis prototype, γ(k) is the synthesis prototype, N is the decimation rate, and M is the number of channels. This equation will have a finite number of nonzero terms. The synthesis filter is the solution to the matrix form:

$$Ax=b \qquad \text{Equation (15)}$$

where A is a rectangular matrix consisting of rows with shifted, desampled coefficients from the analysis prototype, b is a vector with either zero or 1/M as entries, and x is the synthesis filter to be solved for. Since A is rectangular, x can be solved for by using the psuedo inverse of A:

$$x=(A^TA)^{-1}A^Tb \qquad \text{Equation (16)}$$

If the rank of matrix A is less than the length of the vector x, then the solution is underdetermined and the vector x will correspond to the minimum energy solution to the set of linear constraints. Qian and Chen, Joint Time-Frequency Analysis. Englewood Cliffs, N.J.; Prentice Hall, 1996 state that the minimum energy solution is the solution "optimally close" to the Analysis function within the set of solutions. Although this gives a reasonable low pass characteristic, this solution may not be optimal.

Referring to the comment that the solution is the result of solving for an underdetermined system, it can be seen from equation 14 that the number of unique linear equations, equal to the rank of the matrix A, is equal to:

$$\text{\#eqn's}=N(m_f+m_h-1) \qquad \text{Equation (17)}$$

where N is the decimation factor, and $m_f$ and $m_h$ are the lengths of polyphase subfilters (or folding factor) of the synthesis and analysis filters. Therefore, the solution is underdetermined if:

$$N(m_f+m_h-1)<Mm_h \qquad \text{Equation (18)}$$

The previous equations are applicable for case of full band reconstruction. For partial band reconstruction, equations (14) through (18) are modified to use the M/L decimated analysis filter, where L is the number of reconstructed bins. This filter can be generated in a variety of ways:

1) Decimate the Mth band filter by taking every M/L point. This in general does not result in a linear phase synthesis filter, but works well nonetheless.
2) Decimate the Mth band filter using an M/L decimation referenced to the center tap. This requires interpolating equispaced points referenced from the center tap of the filter. This technique generates a linear phase solution, but creates additional amplitude distortion of the recombined channel due to the interpolation function used.
3) If the analysis filter was generated using an Mth band window design, generate a Lth band filter with L/M times the number of taps of the Mth band filter. This is by definition a linear phase solution.

Finally, it should be noted, aside from the analysis filter decimation in the synthesis filter equations, the previous results use constraints that pertain to a full band reconstruction. In particular, the delta function on the right hand side of equation (14) is equivalent to an all-pass. or full band, reconstruction constraint. Although reasonable results can be obtained using these methods, additional work is required to apply a set of partial band reconstruction constraints to the synthesis filter solution. As shown by Nguyen, "Partial Spectrum Reconstruction using Digital Filter banks", IEEE Transactions on Signal Processing, Vol. 41, No 9 September 1993, pp. 2778–2795, in his work on partial alias cancellation filter banks, the recombined channels should be optimized towards having an ideal lowpass characteristic with frequency cutoff $2\pi L/M$.

Synthesis Filter Design Test Results

As described herein, a two times oversampled Analysis/Synthesis filter bank is a good initial starting point and testing was conducted. The two times oversampled Analysis/Synthesis filter bank allows a larger order polyphase prototype filter to be used while still having a sufficiently underdetermined synthesis solution that would yield a reasonable low pass frequency characteristic. As discussed herein there are methods to reduce the oversampling ratio required.

When analyzing performance of a filter banks system, it is necessary to separate out the desired passband response with the frequency response of the individual alias terms. Modifying equation (4) for the case of L reconstructed bins in a two times oversampled system yields the following transfer function:

$$\hat{X}(z) = \sum_{i=0}^{\frac{M}{2}-1} X\left(z^{\frac{L}{M}} W_M^{2i}\right) \sum_{k=0}^{L-1} F_k(z) H_k\left(z^{\frac{L}{M}} W_M^{2i}\right) \quad \text{Equation (19)}$$

This equation could be further enhanced by replacing the subscripted analysis and synthesis filters with a single modulated prototype filter transfer function. Equation (19) has two parts: The terms for i=0 corresponding to the desired term of frequency response, and the other M/2-2 values for i are the alias terms (M/2 being the decimation rate for a twice oversampled filter bank). The goal is to have the desired term of the transfer function approximate an all pass function, while the alias terms have a transfer function as close to zero as possible. Note that the effect of the two times over sampling results in the alias terms being modulated by $W^{2i}$ (refer to the section discussing oversampled DFT filter banks).

Figure 8A:
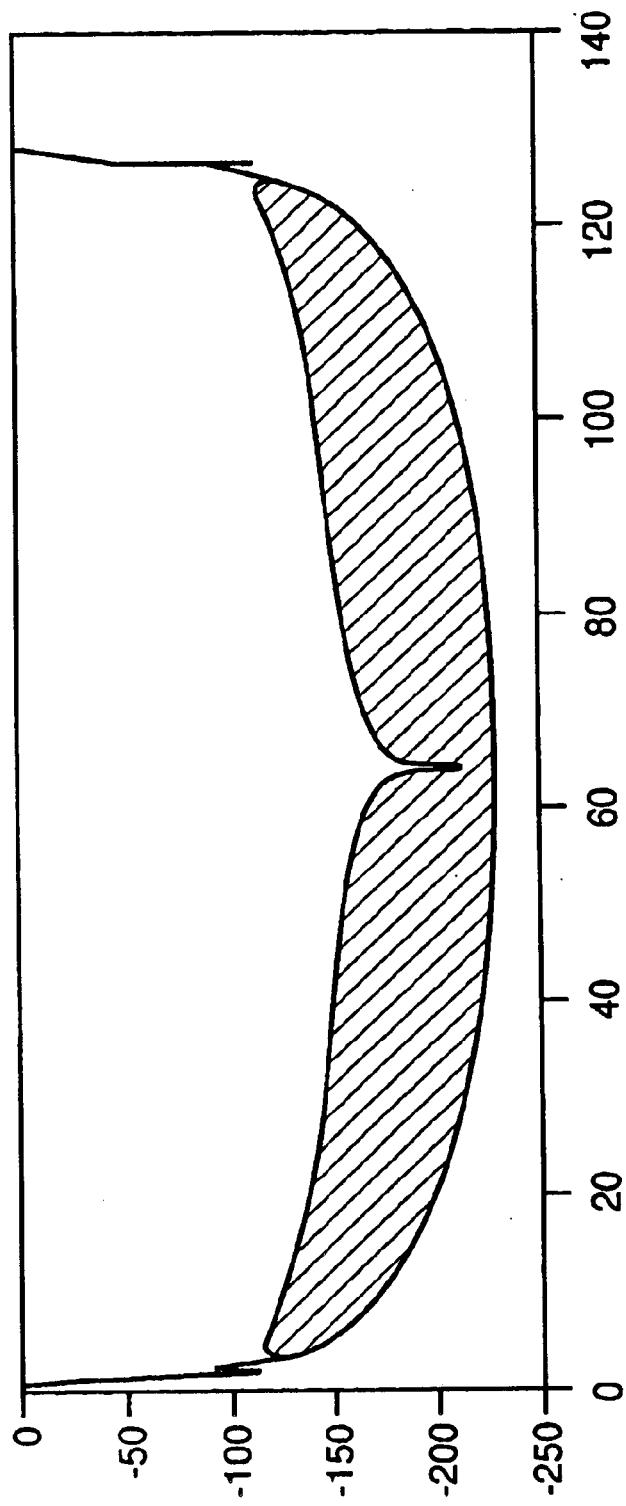
FIGS. 8a, 8b illustrate Frequency Responses for 4 Fold Analysis/8 Fold Synthesis Filters
Figure 8B:
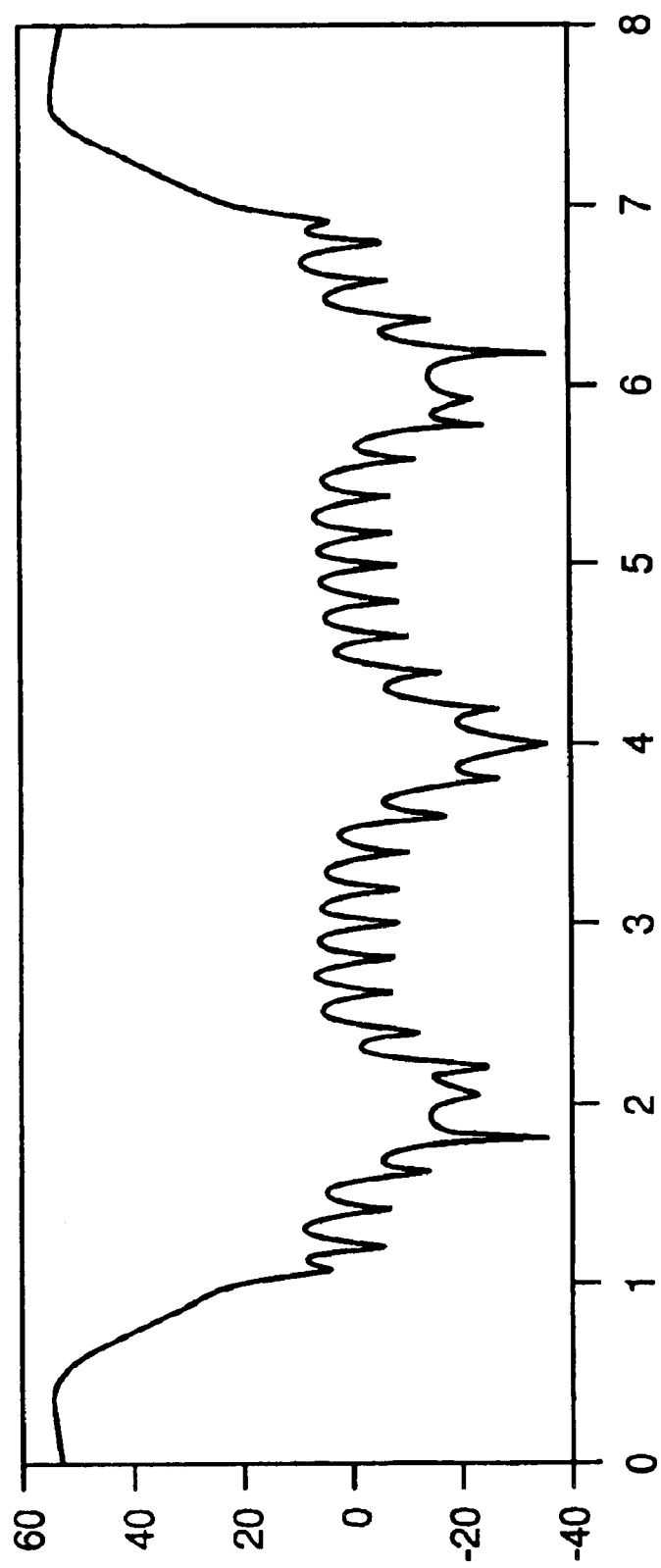
Figure 9:
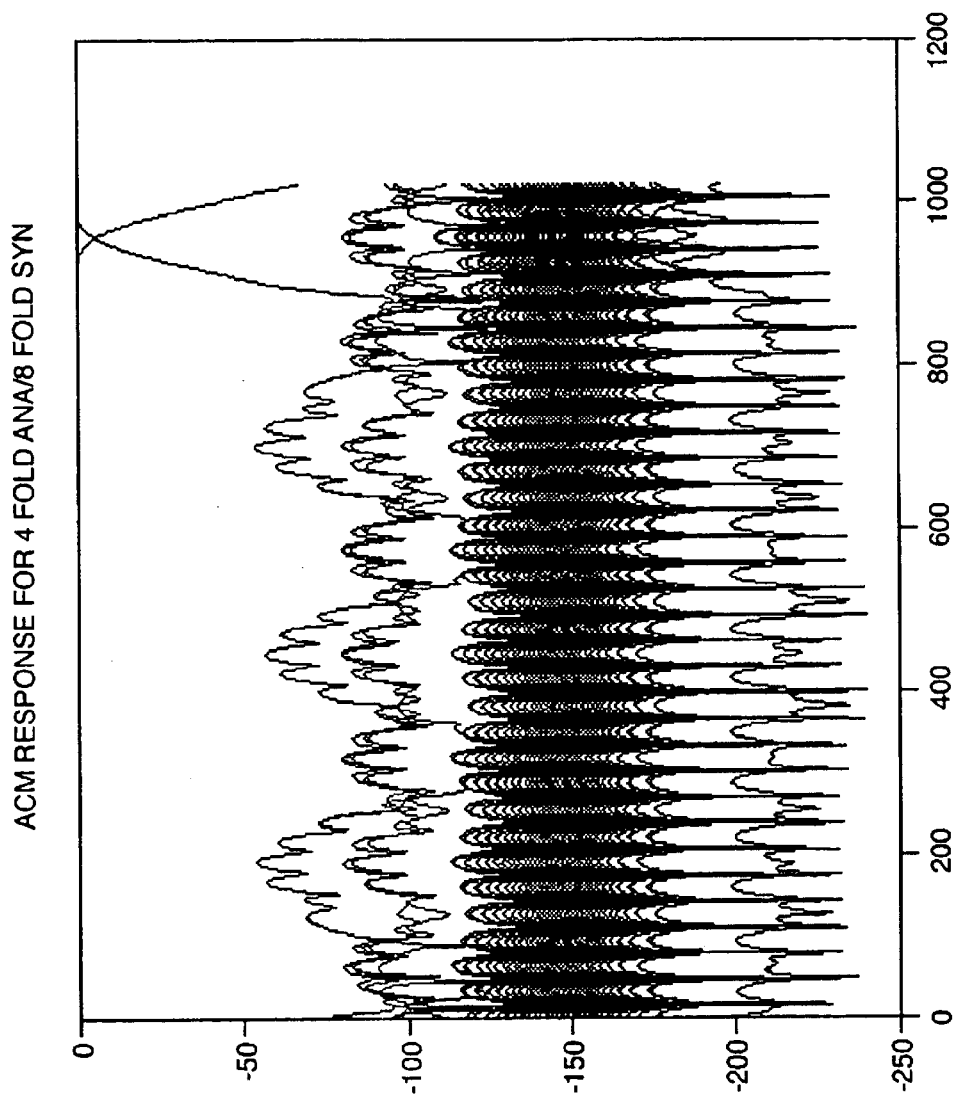
FIG. 9 illustrates Desired and Alias Term Frequency Responses For 4/8 fold analysis/synthesis FIGS. 10a, 10b each illustrate a 4 Fold Analysis/16 Fold Synthesis Frequency Response
Figure 10A:
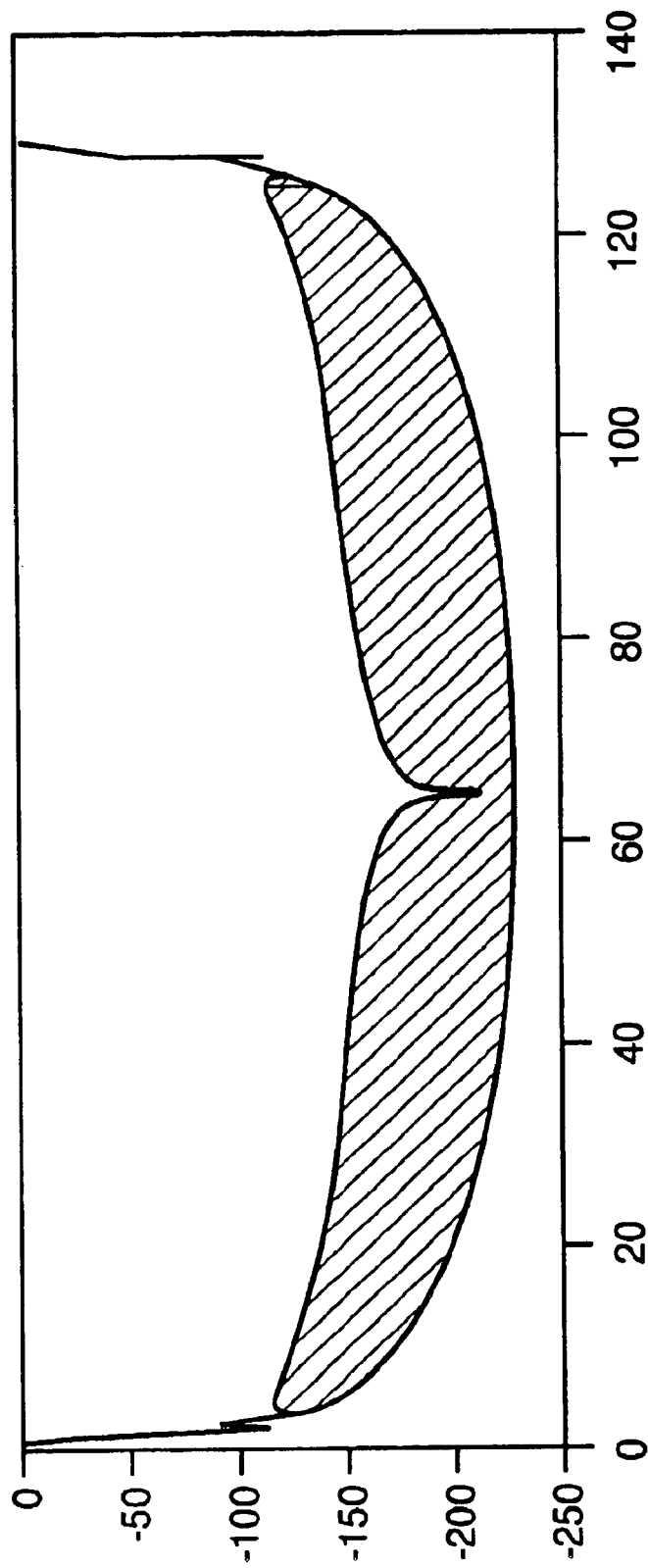
Figure 10B:
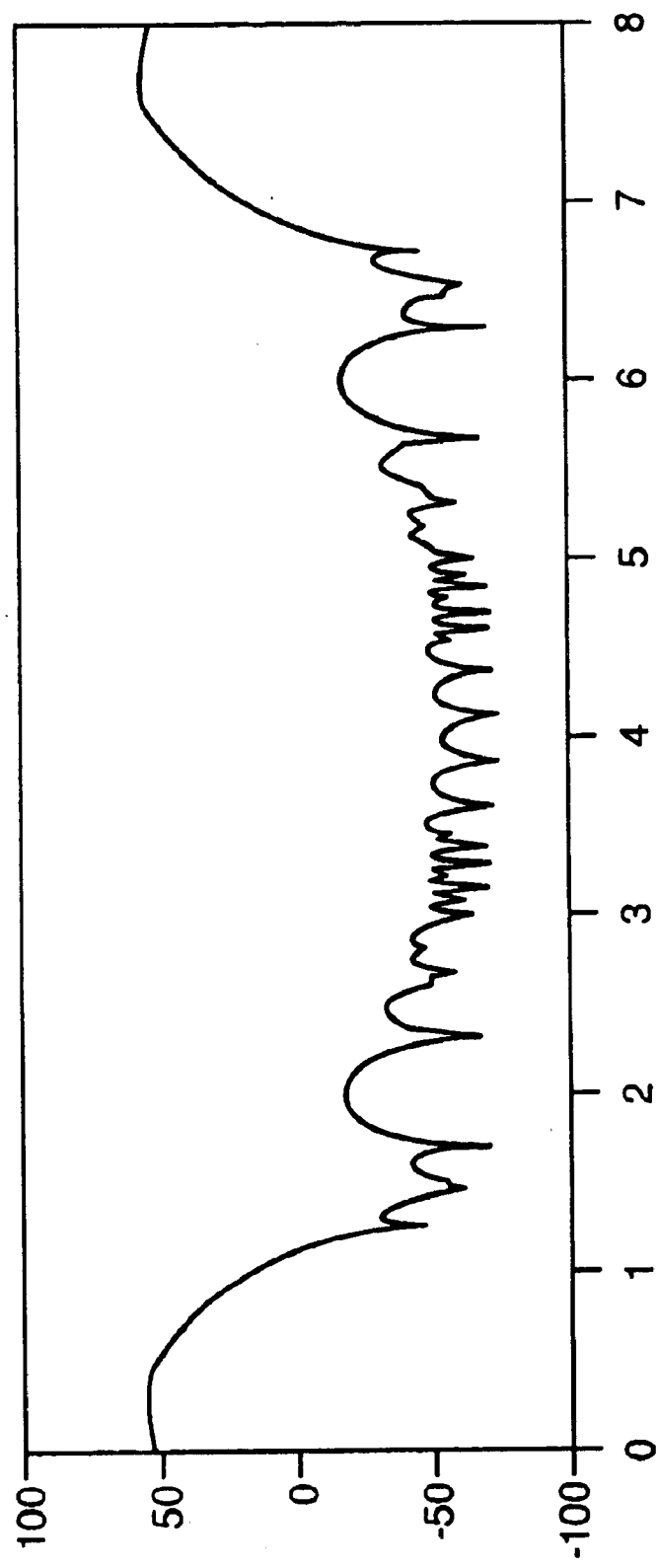
Figure 11:
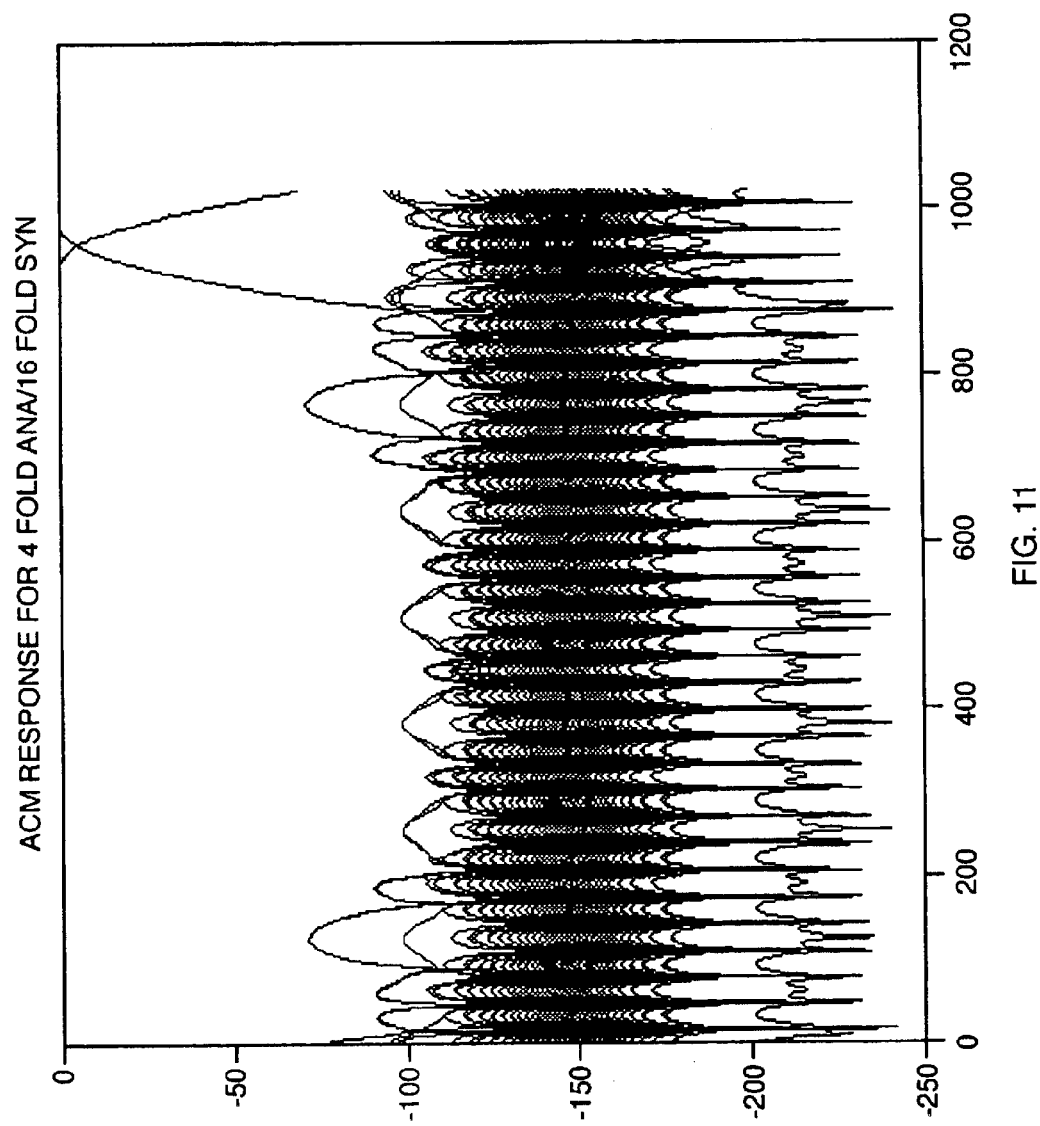
FIG. 11 illustrates a Desired and Alias Terms Frequency Response

The Frequency response for a 4 fold analysis filter and 8 fold synthesis filter is shown in FIGS. 8a, 8b. Note that for the synthesis filters the constraints of the linear equations forces nulls at each of the adjacent L-1 channels. FIG. 9 shows an overlayed plot of the frequency response of the desired term and the individual alias response terms. Notice that the worst case alias terms are better than 50 dB down, while most are suppressed by better than 90 dB. For a 16 fold synthesis filter, worst case aliasing is suppressed by more than 70 dB. The frequency responses and composite alias responses for a 16 fold synthesis filter bank are shown in FIGS. 10a, 10b and 11, respectively.

Additional Optimization Test Results

As described herein, the conditions that constrain the synthesis filter correspond to enforcing orthogonality at discrete points in the time-frequency plane. The psuedo-inverse solution yields the "minimum energy solution", which is the solution optimally close to the analysis filter. Additional testing was performed to assess whether this solution is optimal in terms of the desired alias cancellation properties. In addition, in order to satisfy the orthogonality constraints, better low pass characteristics result in reduced alias levels in the composite frequency response.

Using a quadratic constrained optimization program, it was attempted to minimize the stopband energy of the synthesis filter subject to the set of linear constraints given by equation (14). Initial efforts did not yield an improved filter response; as the decreased stopband energy was met at the expense of excessive passband ripple or insufficient transition band performance.

A second investigation was conducted to determine the degree of oversampling required in the analysis bank. Knowing that the lowpass characteristic would be degraded by reducing the oversampling rate, it was hoped that the above mentioned filter optimization could be used to counteract the loss of alias attenuation. However the test results were not favorable. Two additional oversampling ratios were attempted: 1.5× and critical sampling. The 1.5 times oversampling yielded a barely underdetermined system that yielded a synthesis filter with worst case alias terms of 20 dB. Critical sampling yields an overdetermined matrix. Solving for the MMSE solution yielded a solution with excessive levels of aliasing.

Initial investigations into the use of the partial band reconstruction constraints (See Nguyen, "Partial Spectrum Reconstruction using Digital Filter banks", IEEE Transactions on Signal Processing, Vol. 41, No. 9. September 1993, pp.2778–2795) in the synthesis solution have also been attempted. In general, the attempt to use a single prototype filter leads to an overconstrained system that does not yield a solution with a sufficient low pass response.

An additional application involves the biorthogonal filter design techniques to the Cosine Modulated filter banks. This allows the use of a critically sampled filter bank with an analysis prototype that can meet the desired frequency characteristic. A fast transform technique that results in a reduced computational effort from the equivalent channel size complex filter bank is also required to make this approach worthwhile.

Alias Component matrix is detailed herein, and for the Channelizer in FIG. 3a, 4a, the reconstructed output signal is defined as:

$$\hat{X}(z) = A(z)^T X(z)$$

where $$A(z) = \begin{bmatrix} H_0\left(z^{\frac{R}{P}}\right) & H_0\left(z^{\frac{R}{P}}\right) & \cdots & H_0\left(z^{\frac{R}{P}}\right) \\ H_1\left(z^{\frac{R}{P}}W\right) & H_1\left(z^{\frac{R}{P}}W\right) & \cdots & \\ \vdots & \vdots & & \\ H_{M-1}\left(z^{\frac{R}{P}}W^{M-1}\right) & H_0\left(z^{\frac{R}{P}}W^{M-1}\right) & \cdots & H_0\left(z^{\frac{R}{P}}W^{M-1}\right) \end{bmatrix} \begin{bmatrix} F_0(z) \\ F_1(z) \\ \vdots \\ F_{L-1}(z) \end{bmatrix}$$

and X(z) is defined as $$X(z) = \begin{bmatrix} X\left(z^{\frac{R}{P}}\right) \\ X\left(z^{\frac{R}{P}}W\right) \\ \vdots \\ X\left(z^{\frac{R}{P}}W^{M-1}\right) \end{bmatrix}$$

This is essentially a matrix formulation of equation 4. A(z) is defined as the Alias Component Matrix. In the above matrix, P is the analysis bank decimation factor, R is the synthesis bank interpolation factor, M is the number of analysis channels, and L is the number of synthesis channels. For Alias-Free perfect reconstruction:

$$A(z) = H(z)F(z) = \begin{bmatrix} z^{-n_0} \\ 0 \\ 0 \\ 0 \end{bmatrix}$$

That is, the first Row of the ACM is comprised of the desired terms, which if perfectly reconstructed have a composite frequency response of a unit delay. The other rows are the alias terms that under ideal conditions should cancel, resulting in a frequency response of 0.

The ACM can be modified to incorporate the architecture of the Polyphase DFT filter bank, where the $H_i$ terms are replaced with frequency shifted versions of the single lowpass prototype, with the filter is decomposed into it's polyphase form. This form decomposes into the same orthogonality constraints shown in equation 14. *See Multirate Systems and Filter Banks, P. P Vaidyanathan*, 1993.

One embodiment of the filter bank of the present invention has the following characteristics or design criteria:

1. Analysis bank 4K channels utilizing a 16K polyphase analysis prototype filter with a complex FFT.
2. Analysis filter has better than 90 dB stopband attenuation, a 6 db crossover point with the adjacent channel, and a stopband starting at 1.25 bin spacing.
3. Analysis filter bank uses two times oversampling.
4. Multibin reconstruction utilizes a 16 Fold (Polyphase order +1) synthesis filter and can recombine any power of two multiple of bins.
5. The maximum alias level in the recombined signal data is less than 72 dB with most alias terms below 90 dB.
6. An 8 Fold synthesis bank filter can be used giving a maximum alias term of 50 dB.

Included herein are portions of source code for the filter design methodology that describe one embodiment of the invention. There are four sections of code generated in Matlab format, namely the functions: gen_analysis_filter, gen_bls_filter; gen_coef_sets; and gen_synthesis_filter. Those skilled in the art readily appreciate that the functionality expressed therein is not limited by the literal expression of the code and that there are numerous equivalent manners to present the functions. The comments and source code depict a single embodiment of the present invention.

```
***** gen_analysis_filter *****
function h = gen_analysis_filter(Nchan,Mfold)
%%
%% function h = gen_analysis_filter(Nchan,Mfold)
%%
%% generates analysis filter for Nchan analysis
%% filter bank using blackman harris 74 db filter
%% as input for a window filter design for an
%% Mth band design. The polyphase subfilter length
%% (or folding factor is set by Mfold)
%%
%%    Nchan analysis filter banks channels
%%    Mfold length of polyphase subfilters (i.e. folding factor)
%%
h = fir1(Nchan*Mfold-1,1/Nchan,bh74(Nchan*Mfold));
***** gen_bls_filter *****
function [out,H,T] = gen_bls_filter(h,M,N)
%%
%% function [out,H,T]= gen_bls_filter(in,M,N)
%%
%% generate the taps corresponding to the
%% biorthogonal like sequence that together
%% with the input taps satisfy the
%% biorthogonal like sequence
%
%%    h   input filter coeficients
%%    M   num channels
%% N   decimate rate
%%
%% out solution filter
%%    H   constraint matrix
%%    T        constraint vector
Q1 = length(h);
Q2 = Q1;
g=h;
idx = 1;
H = [];
T = []; %%constraint vector
1_half = fix((Q1-1)/M);
H=zeros(length([0:N-1])*length([-1_half:1_half]),Q2);
for k=0:N-1
   for u=-1_half:1_half
      %%add a row to H and T
      %H = [H; zeros(1,Q2)];
      if u == 0
         T = [T;1/M];
      else
         T = [T;0];
      end
      H(idx,k+1:N:length(g)) = g(k+1:N:length(g));
      H(idx,:) = shift(H(idx,:),u*M);
            idx = idx+1;
   end
end
H;
T;
out = pinv(H)*T;
****** gen_coef_sets ********
Nchan=4096;
Mfold_ana=4;
AnaDec = 2048;
Mfold_synth=16;
ana_filter_coef = gen_analysis_filter(Nchan,Mfold_ana);
synth_filter_coef_8 =
gen_synthesis_filter2(ana_filter_coef,Nchan,AnaDec,8,Mfold_synth);
synth_filter_coef_16 =
```

-continued

```
gen_synthesis_filter2(ana_filter_coef,Nchan,AnaDec,16,Mfold_synth);
synth_filter_coef_32 =
gen_synthesis_filter2(ana_filter_coef,Nchan,AnaDec,32,Mfold_synth);
***** gen_synthesis_filter *****
function [f, A, b] =
gen_synthesis_filter(h,Nchan_analysis,analysis_dec_factor,
Nchan_synthesis,Mfold_synthesis)
%%
%% function [f, A, b] =
gen_synthesis_filter(h,Nchan_analysis,dec_factor,Nchan_synthesis,
Mfold_synthesis)
%%
%%      generates synthesis filter for recombination of L channels based
%% on the input prototype filter
%%
%%      h                       analysis prototype
%%      Nchan_analysis          number of analysis channels
%%      analysis_dec_factor     analysis filter bank decimation factor
%%      Nchan_synthesis   number of recombined channels in synthesis
bank
%%      Mfold_synthesis   length of synthesis subfilters (i.e. folding
factor)
%%
%%
%%      outputs:
%%
%%      f output filter taps corresponding to min E solution
%%      A orthogonality constraint matrix
%%      b orthogonality constraints
%%
M = Nchan_analysis;
nbins = Nchan_synthesis;
m = Mfold_synthesis;
dec_factor = M/analysis_dec_factor;
%hr_tmp=gen_mbr_filter(h,M/nbins);
hr_tmp = h(1:M/nbins:length(h));
M=nbins;
N=M*m-1;
Ntaps = N+1;
Ninterp = nbins/2;
zero_pad_len = (m*M-length(hr_tmp))/2;
[f,A,b] = gen_bls_filter([zeros(1,zero_pad_len) hr_tmp
zeros(1,zero_pad_len)],M,M/dec_factor);
f=f';
```

Numerous characteristics and advantages have been set forth in the foregoing description, together with details of structures and functions of the present invention, and some of the novel features thereof are pointed out in appended claims. The disclosure, however, is illustrative only, and changes may be made in arrangement and details, within the principle of the invention, to the full extent indicated by the broad general meaning of the terms in which the appended claims are expressed.

What is claimed is:

1. A digital channelizer for a wideband signal of K channels, comprising:
    an analysis filter coupled to each of said K channels;
    a fast Fourier transform (FFT) filter bank coupled to said analysis filter for converting each of K channels into a plurality of frequency domain subchannels;
    an inverse FFT filter bank coupled to L channels from said FFT filter bank, wherein L is less than K, and wherein said inverse FFT filter bank converts said L users to a time domain data set; and
    a synthesis filter coupled to said inverse FFT filter bank for performing partial reconstruction of said time domain data set;
    wherein said analysis filter uses a different number of taps than said synthesis filter.

2. The digital channelizer according to claim 1, wherein said analysis filter is a decimation unit and a polyphase filter.

3. The digital channelizer according to claim 1, wherein said synthesis filter is a polyphase filter and an expander unit.

4. The digital channelizer according to claim 1, wherein said synthesis filter uses a mean squared error signal reconstruction.

5. The digital channelizer according to claim 1, wherein said analysis filter is processed according to a composite analysis/synthesis transfer function having grouped filter alias terms.

6. The digital channelizer according to claim 1, wherein said analysis filter has a stop band attenuation greater than about 90 dB.

7. The digital channelizer according to claim 1, wherein said analysis filter has a 6 dB crossover point with an adjacent channel.

8. The digital channelizer according to claim 1, wherein said synthesis filter has a stop band attenuation greater than about 50 dB.

9. The digital channelizer according to claim 1, wherein said synthesis filter is a least squared approximation of the set of linear constraints defined as $$\sum_{i=-\infty}^{\infty} g(k-iN)\gamma^*(k-iN-uM) = \delta(u)/M \quad 0 \le k \le N-1,$$

where g(k) is the analysis prototype, γ(k) is the synthesis prototype, N is the decimation rate, and M is equal to L.

10. A multirate analysis/synthesis filter set for wideband reception and narrowband analysis. comprising:
    an analysis filter section for dividing a complex data stream from said wideband reception into a summed set of K channels; and a synthesis filter section coupled to said analysis filter section, wherein said synthesis filter section recombines said set of K channels into a set of L channels, wherein L is less than K, and wherein said synthesis filter section performs a partial reconstruction of said L channels according to a least squared fit criteria;
    wherein said synthesis filter is a least squared approximation of the set of linear constraints defined as $$\sum_{i=-\infty}^{\infty} g(k-iN)\gamma^*(k-iN-uM) = \delta(u)/M \quad 0 \le k \le N-1$$

where , where g(k) is the analysis prototype, γ(k) is the synthesis prototype. N is the decimation rate, and M is equal to L.

11. The multirate analysis/synthesis filter set according to claim 10, wherein said analysis filter section is comprised of a plurality of P factor decimation units each coupled to a plurality of polyphase subfilters and a K point fast Fourier transform (FFT) section.

12. The multirate analysis/synthesis filter set according to claim 10, wherein said synthesis filter comprises an L-point inverse fast Fourier transform (FFT) section, a polyphase filter and an expander unit.

13. The multirate analysis/synthesis filter set according to claim 10, wherein said synthesis filter section sums a correction term to cancel a residual phase rotation term of said analysis filter.

14. The multirate analysis/synthesis filter set according to claim 10, wherein said analysis filter section and said synthesis filter section are designed using a bioorthogonal-like sequence.

15. A method for designing a single wideband channelizer with narrowband analysis, comprising:

designing an analysis filter based on a number of taps and a set of filter specifications;

solving a synthesis filter for said analysis filter, wherein said solving satisfies perfect reconstruction orthogonality conditions, and said analysis filter uses a different number of taps than said synthesis filter;

processing an input signal into a set of K channels in said analysis filter; and performing a perfect reconstruction of a set of L channels, wherein L is less than K.

16. The method for designing a single wideband channelizer with narrowband analysis according to claim 15, wherein said synthesis filter is a least squares approximation of a set of linear constraints according to the equation:

$$\sum_{i=-\infty}^{\infty} g(k-iN)\gamma^*(k-iN-uM) = \delta(u)/M \quad 0 \le k \le N-1,$$

where g(k) is the analysis prototype, γ(k) is the synthesis prototype, N is the decimation rate, and M is equal to L.

17. The method of claim 15, wherein designing said analysis filter includes configuring said analysis filter to provide a stop band attenuation greater than about 90 dB.

18. The method of claim 15, wherein designing said analysis filter includes configuring said analysis filter to provide a stop band attenuation greater than about 50 dB.

19. The method of claim 15, wherein designing said analysis filter includes configuring said analysis filter to provide a 6 dB crossover point with an adjacent channel.

20. The method of claim 15, wherein designing said analysis filter land solving the synthesis filter includes using a bioorthogonal-like sequence.

* * * * *